US006882155B2

(12) United States Patent
Lazzaro

(10) Patent No.: US 6,882,155 B2
(45) Date of Patent: Apr. 19, 2005

(54) REMOTELY ACTUATED, CIRCUIT TESTING EMERGENCY STOP APPARATUS AND METHOD

(76) Inventor: Vince J Lazzaro, 18 Megan Ct., Glassboro, NJ (US) 08028

( * ) Notice: Subject to any disclaimer, the term of this patent is extended or adjusted under 35 U.S.C. 154(b) by 207 days.

(21) Appl. No.: 10/127,330

(22) Filed: Apr. 19, 2002

(65) Prior Publication Data

US 2002/0195883 A1 Dec. 26, 2002

Related U.S. Application Data

(60) Provisional application No. 60/284,793, filed on Apr. 19, 2001.

(51) Int. Cl.[7] ......................... G01R 31/327; H01H 9/00

(52) U.S. Cl. ....................................... 324/418; 361/190

(58) Field of Search ................................ 324/418, 419, 324/421–424; 361/189, 190; 340/644

(56) References Cited

U.S. PATENT DOCUMENTS 4,573,514 A * 3/1986 Wolf et al. .................. 164/4.1
5,243,291 A * 9/1993 Umemura ................... 324/418
5,559,438 A * 9/1996 Bedouet et al. ............. 324/418
6,297,640 B1 * 10/2001 Hayes ........................ 324/415
6,301,091 B1 * 10/2001 Zomchek et al. ........... 361/189
6,304,189 B1 * 10/2001 Koch et al. ................. 340/664
6,486,674 B1 * 11/2002 Groenewold et al. ....... 324/423
6,734,581 B1 * 5/2004 Griffis ........................ 307/125

* cited by examiner

*Primary Examiner*—Anjan K. Deb
(74) *Attorney, Agent, or Firm*—Woodcock Washburn LLP

(57) ABSTRACT

The present invention is a remotely actuated emergency stop (E-stop) switch, with equipment control circuitry, providing a method for testing the E-stop switch and control circuitry to assure circuit and switch integrity, anytime, without equipment operational interruption, and without negating the manual actuation function of the E-stop switch to immediately cut all power to the equipment. The E-stop switch includes a first relay governing a first control circuit and a second relay governing a second control circuit. Each control circuit governs a motor source control contactor, which, when closed, provides power to the equipment. Transferring energization, and motor control, from the first control circuit to the second control circuit, and vice-versa, allows testing, in turn, of the de-energized components of the E-stop switch and control circuitry while the equipment remains operational. Remote actuation and circuit monitoring and testing is controlled by a Program Logic Controller (PLC).

17 Claims, 21 Drawing Sheets

REMOTELY ACTUATED, CIRCUIT TESTING EMERGENCY STOP APPARATUS AND METHOD

RELATED INVENTIONS

This application claims priority under 35 U.S.C. § 119 (e) to U.S. Provisional Patent Application Ser. No. 60/284,793, filed Apr. 19, 2001, entitled "A Remotely Actuated, Circuit Testing Emergency Stop Apparatus and Method."

FIELD OF THE INVENTION

The present invention relates generally to emergency stop switches and equipment control circuitry, and more particularly to a method and apparatus for testing equipment control circuitry and emergency stop switches while equipment is operating, without sacrificing emergency stop switch functionality.

BACKGROUND OF THE INVENTION

Many devices require electrical power to operate, and controlling the devices during normal conditions, while providing for safety during abnormal conditions, is integral to proper device operation. For example, a typical factory often includes many machines (motors), linked together in operation, and linked to other devices, for handling items to be assembled and for handling tools or items carrying out or supporting the assembly. A typical factory often operates around the clock, twenty-four hours per day, seven days per week.

For safety purposes, the linked machines include an emergency stop (E-stop) switch for terminating electrical power to the machines in an emergency situation. While the design of an emergency stop device may vary, the device generally includes a switch which converts from a normal state to an emergency state when an emergency stop is necessary, the emergency state overriding all other robot controls to remove power from all electrically driven devices, causing all moving parts to stop, and to remove power from all other hazardous functions present in the safeguarded space without causing additional hazards.

Components controlling the devices during normal conditions, and the E-stop switches controlling (shutting down) operation during abnormal conditions, can become faulty. Fault conditions generally result from two causes: 1) a failed switch; and/or 2) an inadvertent hot wire. A failed switch usually results from a fused contact, often occurring after a rated contact current is exceeded. Because many power sources are not well regulated, current surges are not uncommon, therefore, fused contacts occasionally occur. Also, environmental conditions can affect contact surfaces, contributing to contact failure. If a contact in an E-stop switch, control circuit, or power relay becomes fused, there is often no way to know until the equipment becomes uncontrollable. Furthermore, an inadvertent (stray) hot wire can short circuit a switch, or provide power to a motor from an inadvertent source by bypassing a switch.

The ability to periodically inspect and/or test switch components, equipment control circuitry, and the E-stop switches, is a very important part of successful preventive maintenance plan, but such inspection/testing is not always possible, or at least not practical. Although there are no strict standards for the testing of E-stop switches and equipment control circuitry, most are not adequately tested because of the interference testing has with equipment operation.

For the foregoing reasons, there is a need for an E-stop device, and associated equipment control circuitry, allowing for testing of the control circuitry and E-stop switch, at anytime, while the equipment is in operation, or idle, without interfering with or prohibiting the capability of the E-stop switch to de-activate all energy sources to the equipment in the event of a mishap or accident.

SUMMARY OF THE INVENTION

The present invention is a remotely actuated emergency stop (E-stop) switch, with associated equipment control circuitry, and a method for testing same, at anytime, to assure circuit and switch integrity. The present invention can perform the testing of all circuit devices that control power to equipment while the equipment is in operation, without operational interruption, and without negating the manual actuation function of the E-stop switch (i.e., to immediately cut all power to all equipment), to specifically detect: 1) failed switches or fused contacts; and/or 2) inadvertent power sources. Since the manual E-stop portion of this E-stop switch functions exactly as any standard E-stop switch, the E-stop switch of the present invention can be used in any hierarchy of relay configuration safety categories (i.e., categories 1 through 4 as defined in EN 954-1).

In one aspect of the present invention, the E-stop switch includes a first relay governing a first control circuit in the E-stop switch and a second relay governing a second control circuit in the E-stop switch. Transferring energization from the first control circuit to the second control circuit, and vice-versa, allows testing of the E-stop switch while maintaining electrical operation of equipment served by the E-stop switch and maintaining manual actuation capability of the E-stop switch to shut down the equipment served by the E-stop switch in an emergency situation.

In another aspect of the present invention, testing of the E-stop switch could include testing of the E-stop switch and control circuitry for a failed switch, a fused contact, an inadvertent power source, or a ground. The relays within the E-stop switch could be any device capable of activating change in an electric circuit in response to a change affecting the device. Or, each relay could include at least one coil, such as a solenoid, and at least one associated contact. Or, each relay could include at least one motor and at least one associated contact. Or, each relay could be driven by other mechanical, thermal, or pneumatic means.

In another aspect of the present invention, the transfer of energization from one control circuit to another could be governed by a Programmable Logic Controller (PLC). The PLC is programmed by a specific software program included as part of the present invention.

In another aspect of the present invention, during equipment operation, and remote actuation/testing of the E-stop switch, manual actuation of the E-stop switch separates a first contact, or first set of contacts, of each relay such a distance from a second contact, or second set of contacts, of the respective relay, that each relay is incapable of maintaining or achieving a closed, energized state to, thereby, maintain or allow electrical operation of the equipment served by the E-stop switch.

In another aspect of the present invention, during equipment operation, and remote actuation/testing of the E-stop switch, manual actuation of the E-stop switch moves a coil of each relay such a distance that each relay is incapable of maintaining or achieving a closed, energized state to, thereby, maintain or allow electrical operation of the equipment served by the E-stop switch.

In another aspect of the present invention, operation of the E-stop switch has one of the first or the second relay closed to energize the respective control circuit to maintain electrical operation of equipment served by the E-stop switch, the other of the first or the second relay open to de-energize the respective control circuit to allow testing of the E-stop switch during electrical equipment operation, while not prohibiting manual actuation of the E-stop switch to de-activate electrical operation of the equipment served by the E-stop switch.

In another aspect of the present invention, a method for testing the E-stop switch and equipment control circuitry includes transferring energization from a first control circuit to a second control circuit to maintain electrical operation of equipment served by the E-stop switch before, during, and after the transfer, testing the first control circuit, then transferring energization from the second control circuit to the first control circuit to maintain electrical operation of equipment served by the E-stop switch before, during, and after the transfer, and testing the second control circuit.

In another aspect of the present invention, a method for testing the E-stop switch and equipment control circuitry of equipment served by the E-stop switch includes electrically starting the equipment served by the E-stop switch, then remotely activating the E-stop switch, opening all contacts therein, to shut down all power to the equipment, and monitoring control circuitry data during remote E-stop activation to test the control circuitry.

In another aspect of the present invention, the control circuit includes two parallel captive motor power source control contactors (primary and secondary), to provide power to the equipment (motor). Each motor source contactor is equipped with a normally closed contact used to provide feedback signals to the PLC. Depressing a start button energizes the primary motor control contactor, allowing power flow to the equipment. Source code governing PLC operation is programmed to energize control circuit relays within the E-stop switch in a set sequence. With the normally closed relay energized, the normally open relay is energized, after a pre-determined time, to allow control power to flow through the secondary motor control contactor. Both motor control contactors are now energized forming a parallel circuit. When the normally closed relay within the E-stop switch is then opened, the primary motor control contactor is de-energized. The PLC feedback contact of the primary power motor control contactor should indicate an open circuit. If the feedback circuit is not opened within a pre-determined time, a safety fault occurs. If a fault is not detected, the relay is de-energized. Both motor control contactors are again energized. After a predetermined time, the normally open relay is de-energized, the normally closed relay remaining energized to allow power to the equipment. The PLC feedback contact of the secondary motor control contactor should now indicate an open circuit. If the feedback circuit is not opened within a pre-determined time, a safety fault occurs. When a fault is detected a visual warning is displayed and the PLC halts all testing.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

DEFINITION OF TERMS

Relay: in one aspect, a device activating changes in an electric circuit, in response to other changes affecting itself; or, in a more specific aspect, an electromechanical device for remote or automatic control that is actuated by variation in conditions of an electric circuit and that operates to turn devices (as switches) in the same or in a different circuit. The relay could be driven by a solenoid, a motor, or some other mechanical, thermal, or pneumatic means.

Solenoid: in one aspect, a coil of wire acting as a magnet when carrying electric current; or, in a more specific aspect, a coil of wire that, when carrying a current, resembles a bar magnet to draw or reciprocate a movable core within and along the axis of the coil.

Emergency Stop (E-stop) switch: a switch that converts from a normal state to an emergency state in a hazardous situation, the emergency state overriding all other robot controls to remove power from all electrically driven devices, causing all moving parts to stop, and removing power from all other hazardous functions present in a safeguarded space without causing additional hazards.

Emergency Stop (E-stop) Switch Design: in accordance with American National Standard Institute (ANSI) 4.6.3, push-buttons that activate an E-stop circuit shall be: a) red in color with a yellow background; b) unguarded c) palm or mushroom head type; d) the type requiring manual resetting; e) installed such that resetting the button shall not initiate a restart.

Tied-down: a condition where a switch contains a contact stuck closed, perhaps fused, and will not release.

DETAILED DESCRIPTION OF THE INVENTION

Figure 1:
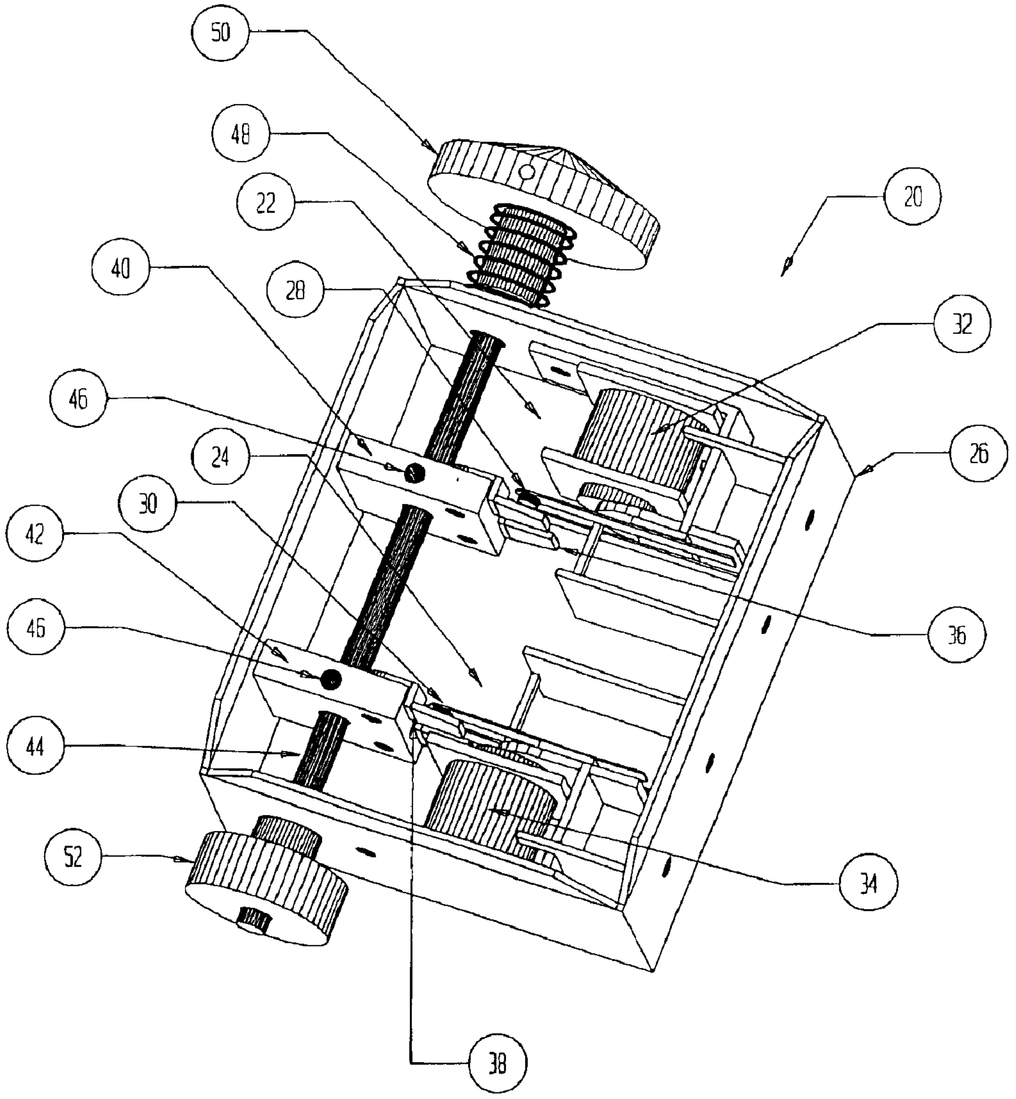
FIG. 1 illustrates a first embodiment (with cover removed) of an emergency stop (E-stop) switch of the present invention.

Referring now to the drawings, where like numerals indicate like elements, there is shown in FIG. 1 a first embodiment of an Emergency Stop (E-stop) switch 20 of the present invention.

A First Embodiment of the Emergency Stop (E-stop) Switch

The E-stop switch 20 of FIG. 1 includes two relays 22, 24 fixedly mounted in an enclosure 26. The relays 22, 24 are aligned so that magnetically movable contact blocks 28, 30 (one movable contact block for each relay 22, 24) are positioned on an inner side (relative to the enclosure 26) of a solenoid (or coil) 32, 34 (one solenoid for each relay 22, 24). The solenoids 32, 34 align as if sharing a common shaft.

Stationary contact blocks 36, 38 (one stationary contact block for each relay 22, 24) are each fixedly mounted on a respective insulator block 40, 42 (one insulator block for each relay 22, 24). The insulator blocks 40, 42 are each fixedly connected, by a setscrew 46, to a single, spring-loaded shaft 44, which passes completely through the enclosure 26. A spring 48 on the shaft 44 secures the shaft 44 in a fixed position relative to the enclosure 26 and the relays 22, 24.

The insulator block 40 for the stationary contact block 36 of the first relay 22 is positioned on the shaft 44 so that the magnetically movable contact block 28 is normally closed (i.e., in electrical contact with the stationary contact block 36). The insulator block 42 for the stationary contact block 38 of the second relay 24 is positioned on the shaft 44 so that the magnetically movable contact block 30 is normally open (i.e., not in electrical contact with the stationary contact block 38).

In a non-active state (i.e., the equipment served by the E-stop is not electrically operating), the contacts of one relay are closed and the other relay are open. Note: the magnetically movable and the stationary contact blocks 28, 30, 36, 38 can each include one, two, three, four, or more actual contacts to allow for switching of various control and status type circuitry. As shown, the FIG. 1 E-stop embodiment includes two contacts per contact block.

The shaft 44 includes, in addition to the spring 48, an unguarded, red, mushroom shaped head 50 for manual (human palm) actuation, and a latching mechanism 52 for manual resetting, in accordance with ANSI 4.6.3 and European Machine Standard EN 418. When the shaft 44 is depressed, all contact blocks 28, 30, 36, 38 are opened. Manual activation of the E-stop switch 20 (depressing the shaft 44), at any time, always separates the contact blocks 28, 30, 36, 38, whether normally open or normally closed, whether actually open or closed, and regardless of any electrical activation of relay solenoids. Manual activation of the E-stop switch 20 of the present invention immediately halts power to the equipment served by the E-stop switch 20, just like a typical Emergency Stop switch.

In the FIG. 1 embodiment of the present invention, there are twelve wires (not shown). Eight of the twelve wires are used for switches, one wire connected to each actual contact, with one contact on a movable contact block and one contact on a stationary contact block forming a complete circuit (single switch) for a total of four switches in the E-stop switch 20. The remaining four wires are connected to the solenoids 32, 34 of the relays 22, 24, two wires to each solenoid 32, 34. A Programmable Logic Controller (PLC) maintains a control system which governs the solenoids 32, 34, in accordance with a source program, to open and close the relays 22, 24 (i.e., open and close the contacts) in a pre-determined sequence.

A First Embodiment of Control Circuitry and Sequence Testing:

FIGS. 2 through 11 illustrate an elementary diagram of one embodiment of a control reliable circuit incorporating the E-stop of the present invention into control circuitry serving one or more items of electrical equipment (simply denoted as Motor in FIGS. 2–11).

The control reliable circuit includes two parallel motor source contactors MC1, MC2, two control circuits, a safety relay and one or more E-stops. The motor could be started by a momentary push button switch (start) and stopped by opening a safety device, including activating the E-stop. The E-stop relays, and associated control circuits, are energized and de-energized in a timed sequence by a PLC. The first E-stop relay could govern a primary control circuit operating the first motor source contactor MC1, while the second E-stop relay could be considered the E-stop override relay and govern a secondary control circuit operating the second motor source contactor MC2.

Once the equipment (motor) is started and electrically operating, with the primary control circuit energized and first relay closed, the E-stop override relay (and secondary control circuit) could be energized at any pre-determined time (seconds, minutes, hours) thereafter. With both relays energized (closed), both motor source contactors MC1, MC2 are providing power to the motor.

The first relay is then opened, and the primary control circuit de-energized, to open the first motor source contactor MC1, cutting power to the motor from this contactor. With the first relay, the primary control circuit, and the first motor source contactor MC1 de-energized, electrical testing at the first motor source contactor MC1 can check wiring, switches, contacts, and relays for faults, without shutting down electrical power to the motor (now served through the second motor source contactor MC2), assuring that the safety circuits, including the E-stop components, are capable of shutting down the motor in the event of an emergency by activation of a safety device, including manual depression of the E-stop.

The testing sequence continues, with energization of the first relay and primary control circuit, allowing power to the motor again through the first motor source contactor MC1, with subsequent de-energization of the second relay and secondary control circuit, thereby shutting down power to the motor through the second motor source contactor MC2. The above-mentioned testing can then occur at the second motor source contactor MC2. This energizing and de-energizing of the first and the second relays, control circuits, and motor source contactors, can cycle many times through out the day, week and/or year, to provide ongoing testing of all circuitry serving the equipment.

Figure 2:
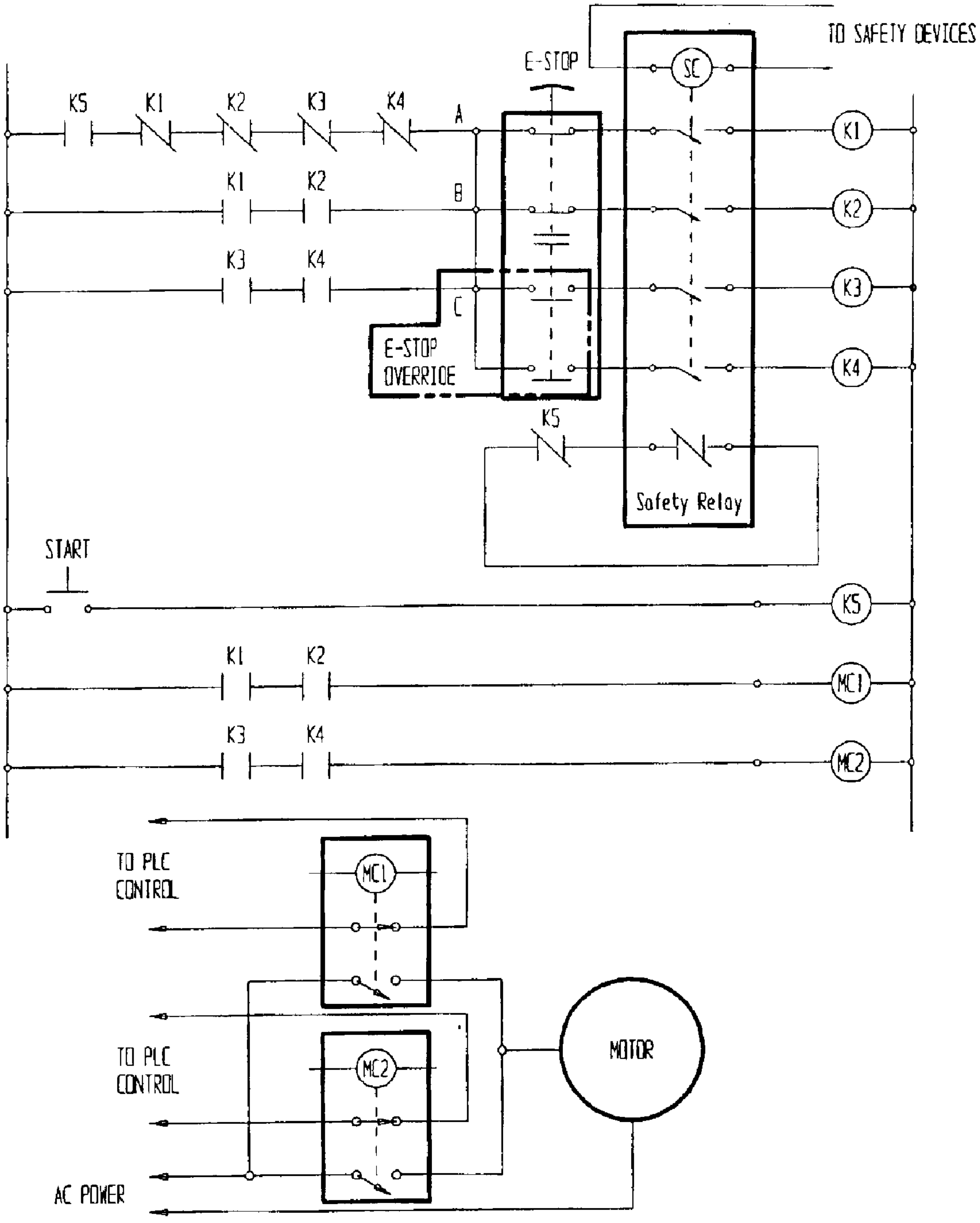
FIG. 2 illustrates a first embodiment of control circuitry of the present invention, incorporating the E-stop switch of FIG. 1, that governs power to a load (equipment) while periodically testing and monitoring the control circuit and E-stop switch, FIG. 2 showing the control circuit in a motor non-operating condition.

Wiring Description of the First Control Circuit Embodiment:

Referring to FIG. 2, the following is a brief wiring description: the safety relay coil is wired in series with all safety devices. Normally open contact K5 is in series with normally closed contacts K1, K2, K3 and K4, which are in parallel with normally open series contacts K1 and K2 and normally open series contacts K3 and K4.

Normally open contact K5 is in series with normally closed contacts K1, K2, K3, K4, through the normally closed E-Stop contact and normally open Safety Relay contact to coil K1. Normally open contacts K1 and K2 are in series and pass through the normally closed E-Stop contact and normally open Safety Relay contact to coil K2. Normally open contacts K3 and K4 are in series and pass through the normally open E-Stop contact and normally open Safety Relay contact to coil K3.

The normally closed contact K5 forms a closed loop with the safety relay at the safety relay closed loop terminals. The normally open start switch is in series with coil K5. Normally open series contacts K1 and K2 are in series with coil MC1, and normally open series contacts K3 and K4 are in series with coil MC2.

AC power is connected to normally open contacts of MC1 and MC2. The motor is connected to the normally open contacts of MC1 and MC2. AC power is connected to the motor.

A PLC input is connected to the normally closed contact of MC1. A PLC input is also connected to the normally closed contact of MC2.

Method of Operation of the First Control Circuit Embodiment-Remotely Activated Testing:

Referring to FIGS. 2 through 11, the following is a detailed step by step description of circuit operation through a brief description of each figure to further explain the testing sequence referenced above, and introduce the incorporation of other safety devices into the control circuitry.

FIG. 2 illustrates the normal (inactive) circuit with the safety device circuit open. The contacts of contactors MC1 and MC2 (the PLC monitor circuits) must be closed or a fault is displayed.

Figure 3:
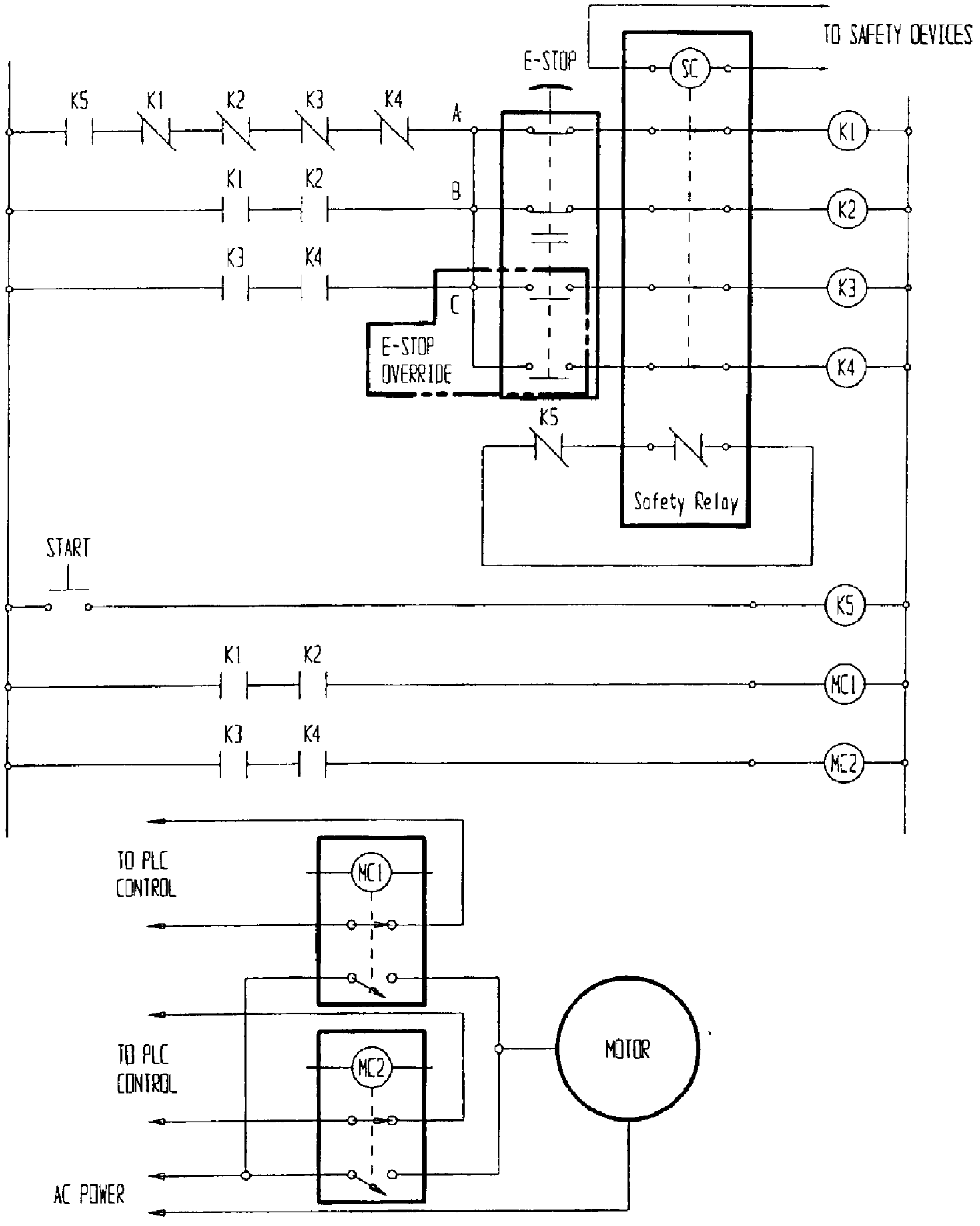
FIG. 3 illustrates the control circuitry of FIG. 2, showing the control circuit with a safety device circuit satisfied, a safety coil energized, and all safety relays closed, allowing motor start-up.

FIG. 3 illustrates all equipment safety devices closed and safety relay coil SC energized. This satisfies the requirement of the safety relay.

Figure 4:
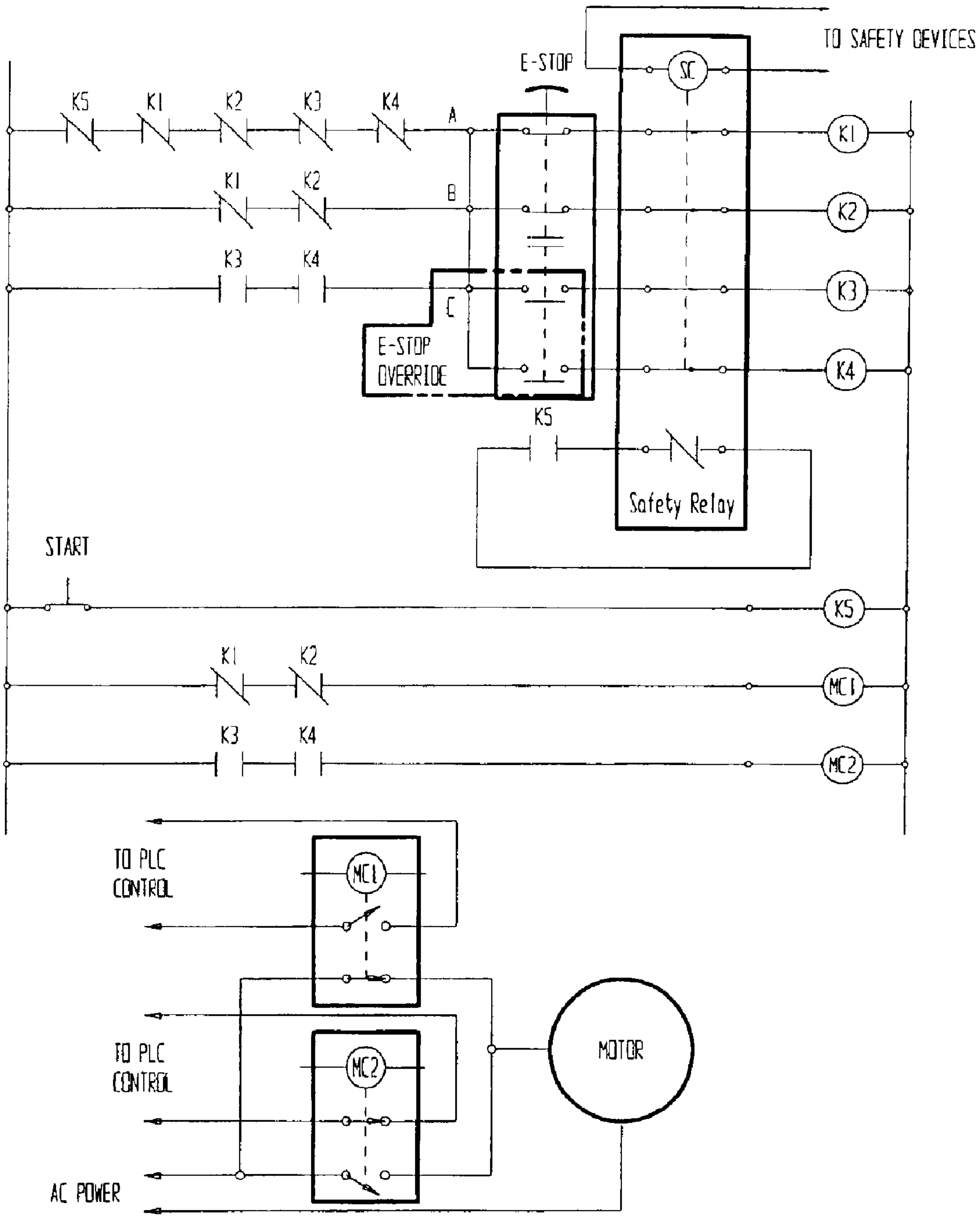
FIG. 4 illustrates the control circuitry of FIG. 2, showing the control circuit with start button momentarily depressed, energizing coil K5, thereby energizing coils K1 and K2 to close associated contacts K1 and K2, thereby energizing coil MC1 to start the motor.

FIG. 4 illustrates the start button momentarily depressed. Coil K5 is energized. Contact K5 closes and energizes coils K1 and K2. The contacts K1 and K2 close energizing contactors MC1. The motor starts to run.

Figure 5:
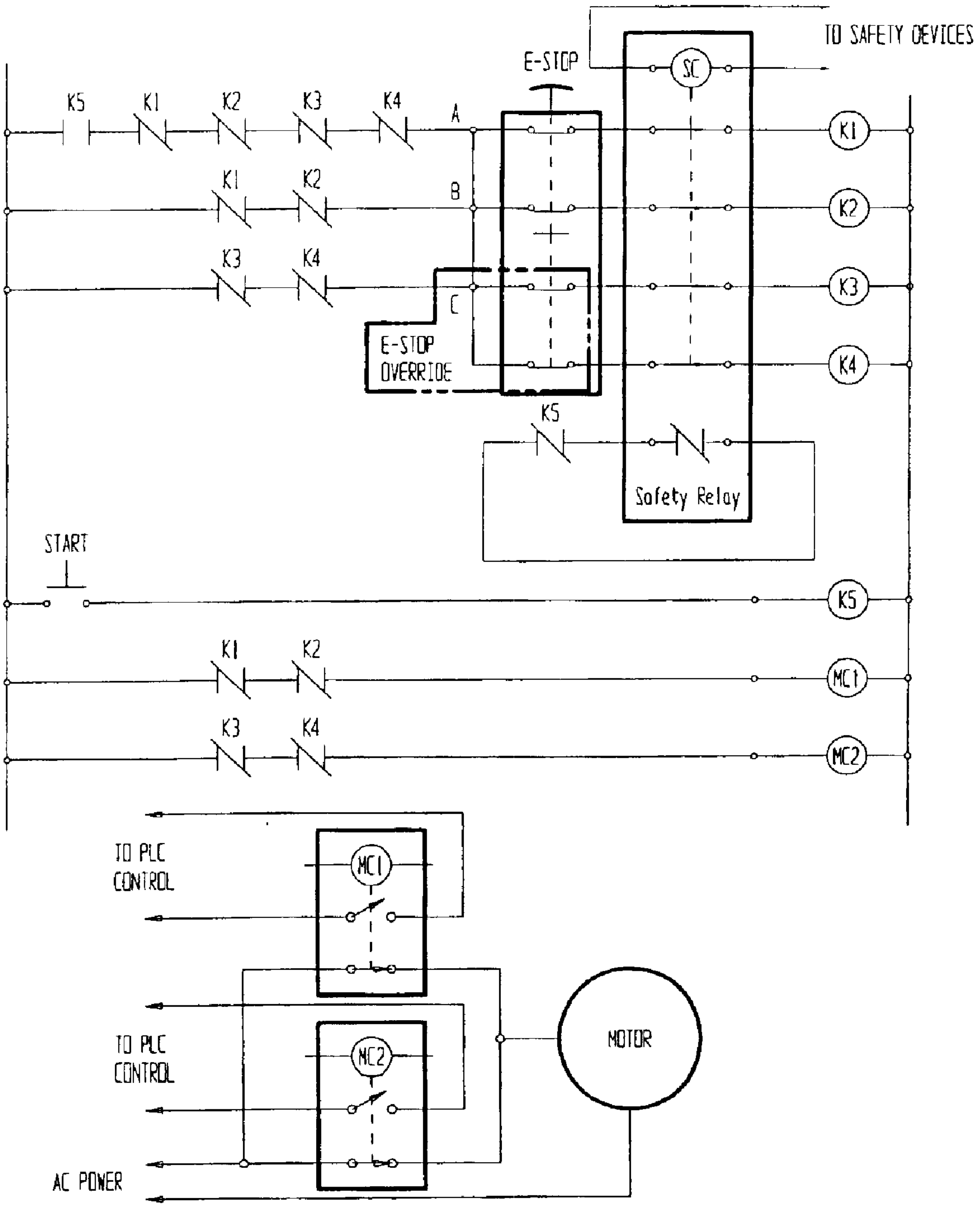
FIG. 5 illustrates the control circuitry of FIG. 2, showing the control circuit with an override relay of the E-stop switch closed, energizing coils K3 and K4 to close associated contacts K3 and K4, thereby energizing coil MC2, providing parallel power sources to the motor.

FIG. 5 illustrates the E-stop override relay energized. This energizes coils K3 and K4. Contacts K3 and K4 close energizing contactor MC2. The motor now has a parallel power circuit.

Figure 6:
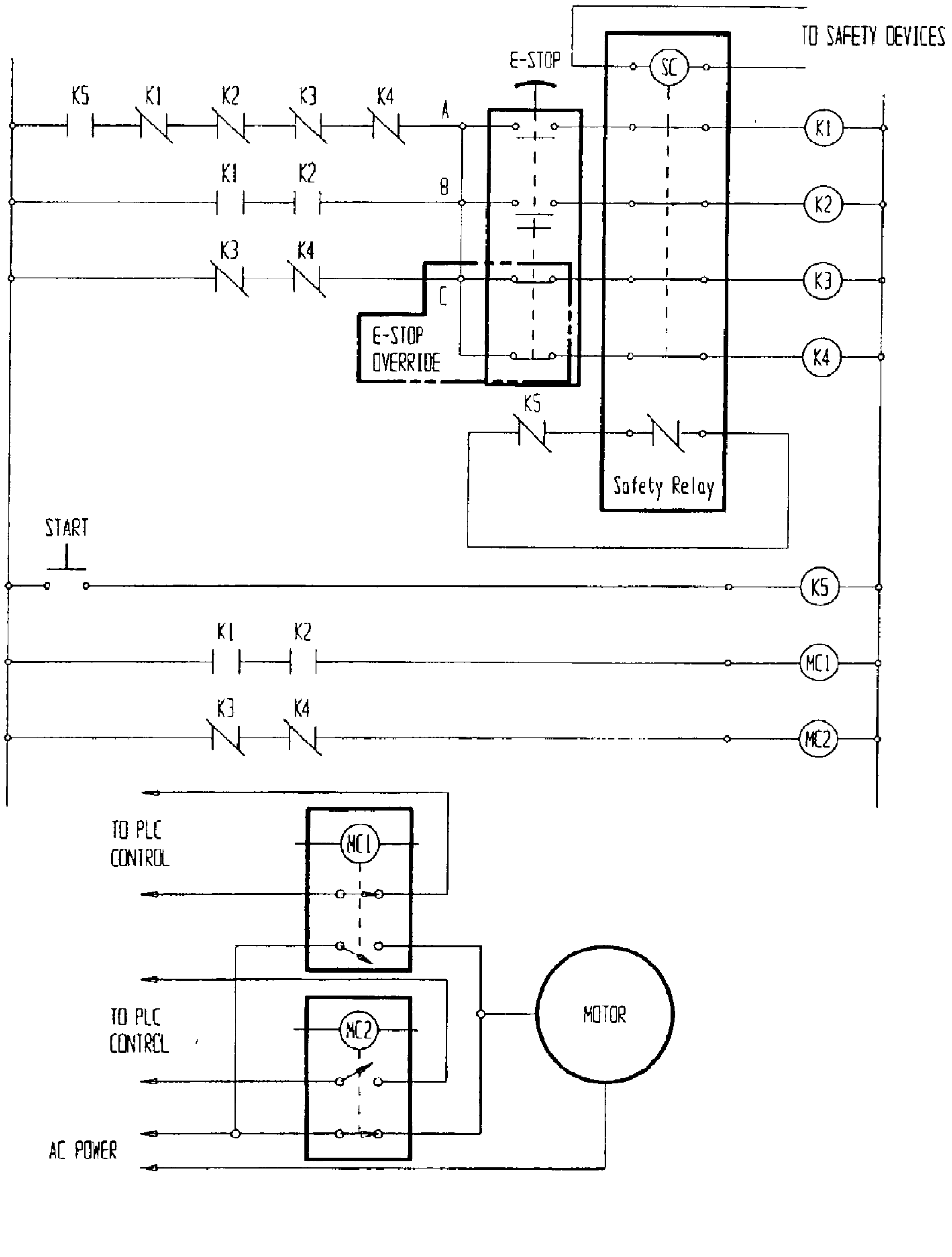
FIG. 6 illustrates the control circuitry of FIG. 2, showing the control circuit with a primary relay open, de-energizing coils K1 and K2 to open associated contacts K1 and K2, thereby de-energizing coil MC1, allowing testing of the de-energized control circuit while the motor continues to operate.

FIG. 6 illustrates the first E-stop relay de-energized. Coils K1 and K2 are de-energized. Contacts K1 and K2 open, de-energizing contactor MC1. Coils K3 and K4 remain energized. Contactor MC2 remains energized allowing the motor to continue to run. The PLC monitors PLC feedback contact at contactor MC1. If the PLC feedback contact does not close, a fault is displayed.

Figure 7:
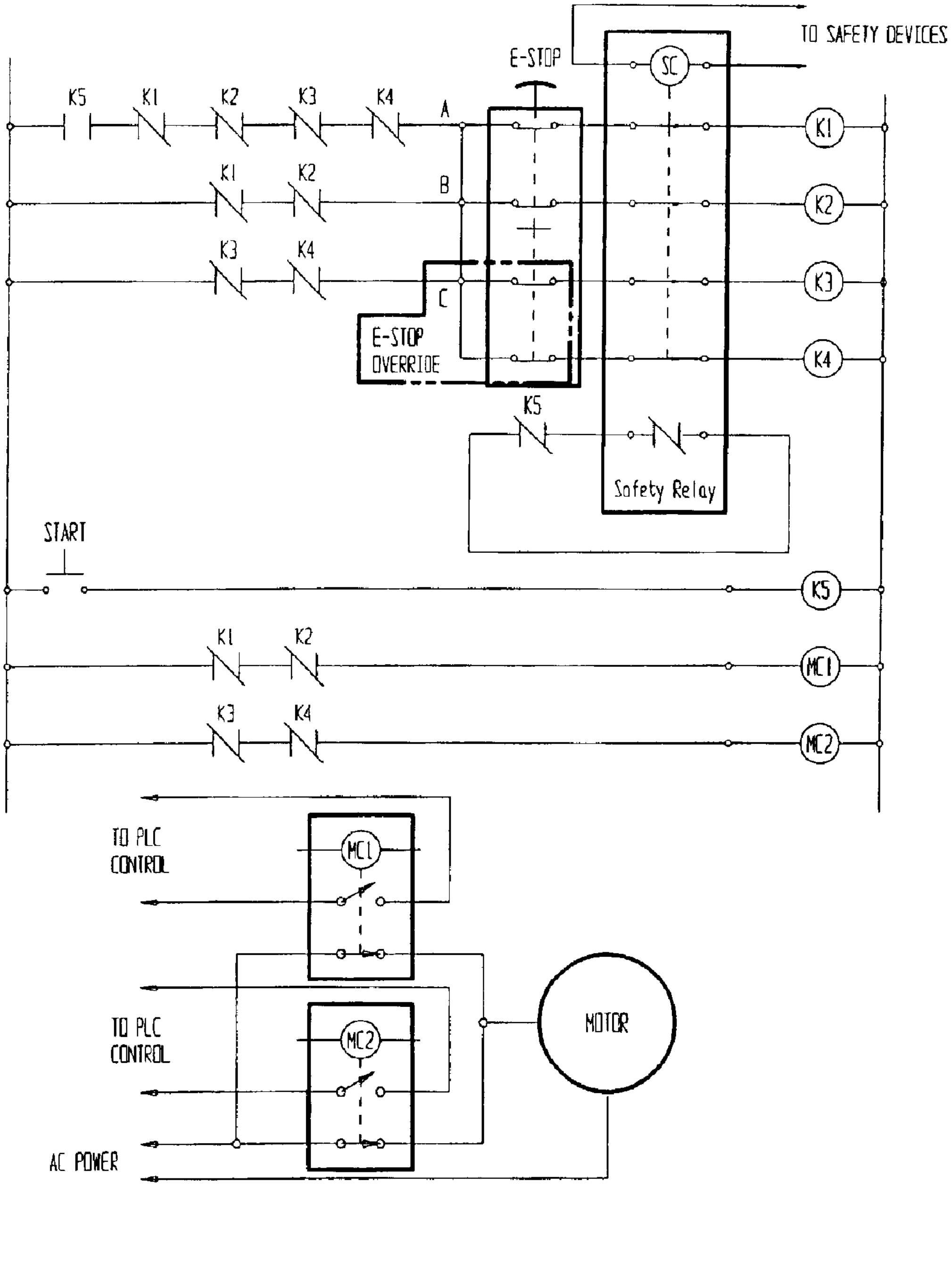
FIG. 7 illustrates the control circuitry of FIG. 2, showing the control circuit with the primary relay again closed, again providing parallel power sources to the motor.

FIG. 7 illustrates the first E-stop relay closed and energized again. Coils K1 and K2 are energized. Contacts K1 and K2 close energizing contactor MC1. Both contactors MC1 and MC2 are energized, both providing power to the motor.

Figure 8:
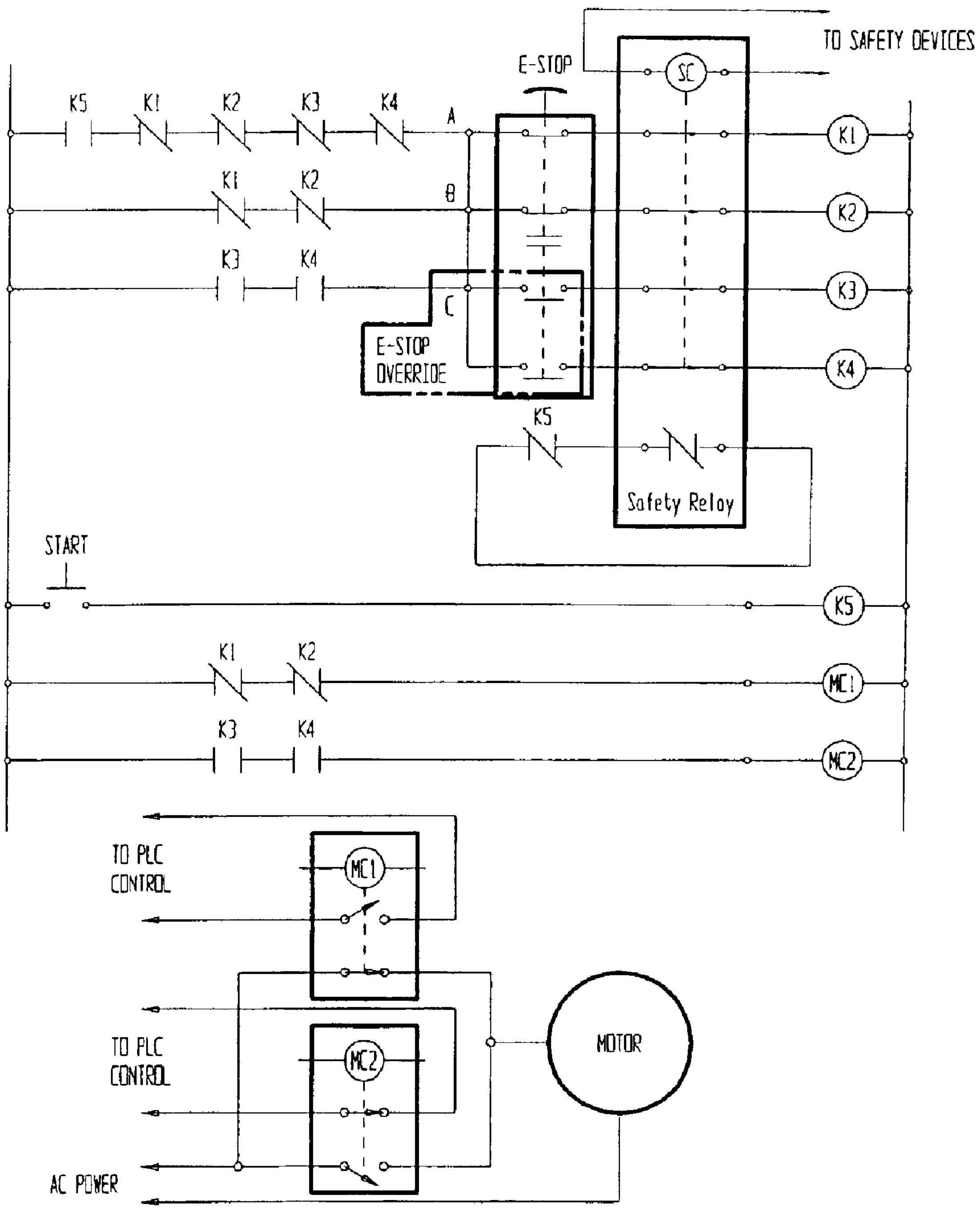
FIG. 8 illustrates the control circuitry of FIG. 2, showing the control circuit with the override relay open, de-energizing coils K3 and K4 to open associated contacts K3 and K4, thereby de-energizing coil MC2, allowing testing of the de-energized control circuit while the motor continues to operate.

FIG. 8 illustrates the E-stop override relay de-energized. Coils K3 and K4 are de-energized. Contacts K3 and K4 open, de-energizing contactor MC2. Coils K1 and K2 remain energized. Contactor MC1 remains energized, allowing the motor to continue to run. The PLC monitors the PLC feedback contact at contactor MC2. If the PLC feedback contact does not close, a fault is displayed.

Figure 9:
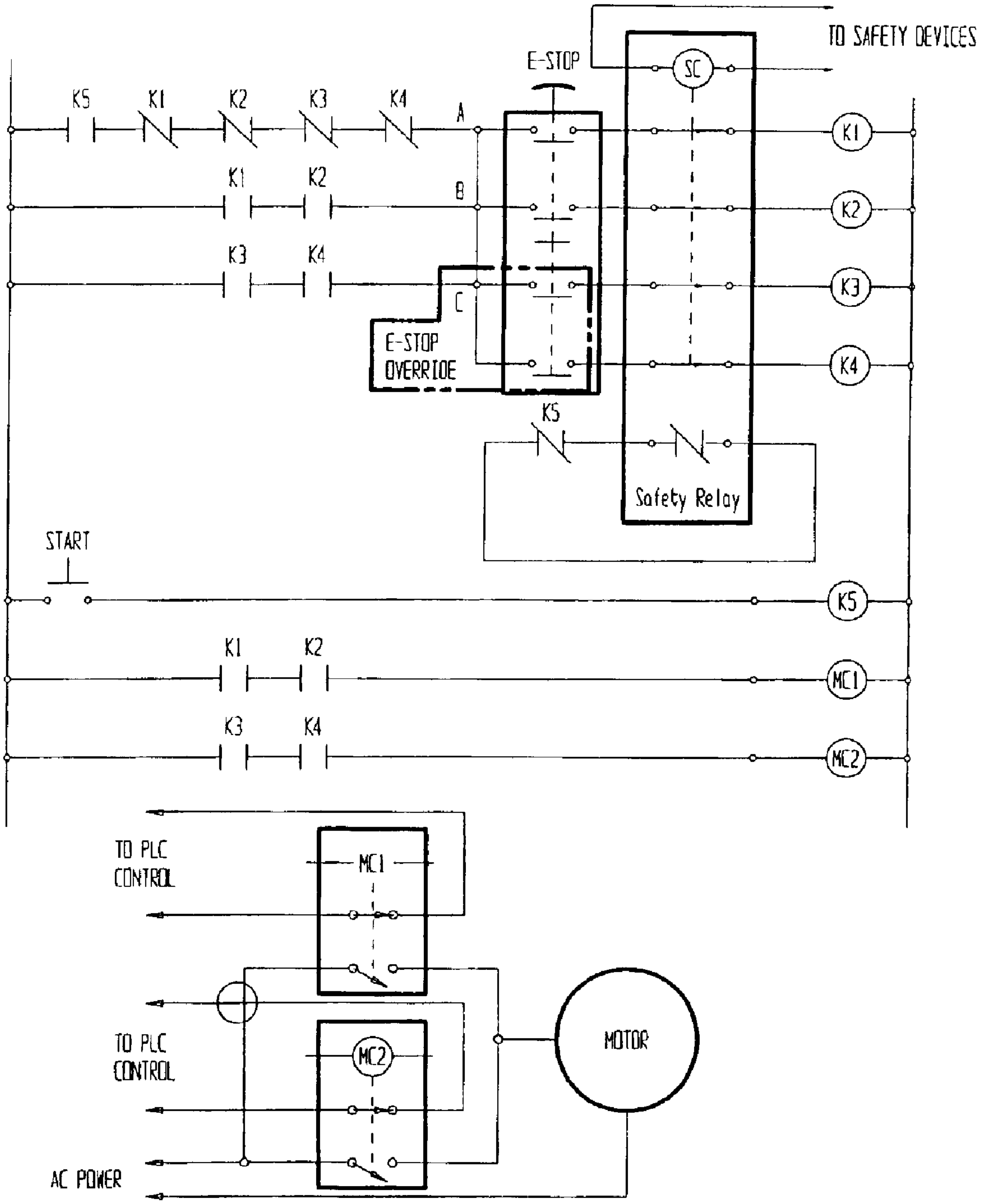
FIG. 9 illustrates the control circuitry of FIG. 2, showing the control circuit with the E-stop switch manually activated to open all contacts therein, de-energizing coils K1, K2, K3, and K4 to open associated coils K1, K2, K3, and K4, opening coils MC1 and MC2 to shut down all power to all equipment, regardless of the desired programmable status for the control circuits and E-stop switch relays.

FIG. 9 illustrates the E-stop manually depressed. All E-stop contacts are forced open. All coils K1, K2, K3, K4 are de-energized. Contactors MC1 and MC2 are de-energized. The motor stops running. All E-stop contacts open, and are locked open pending manual reset, regardless of any E-stop relay attempting to close to energize the primary (first) or the second (secondary) control circuit.

Figure 10:
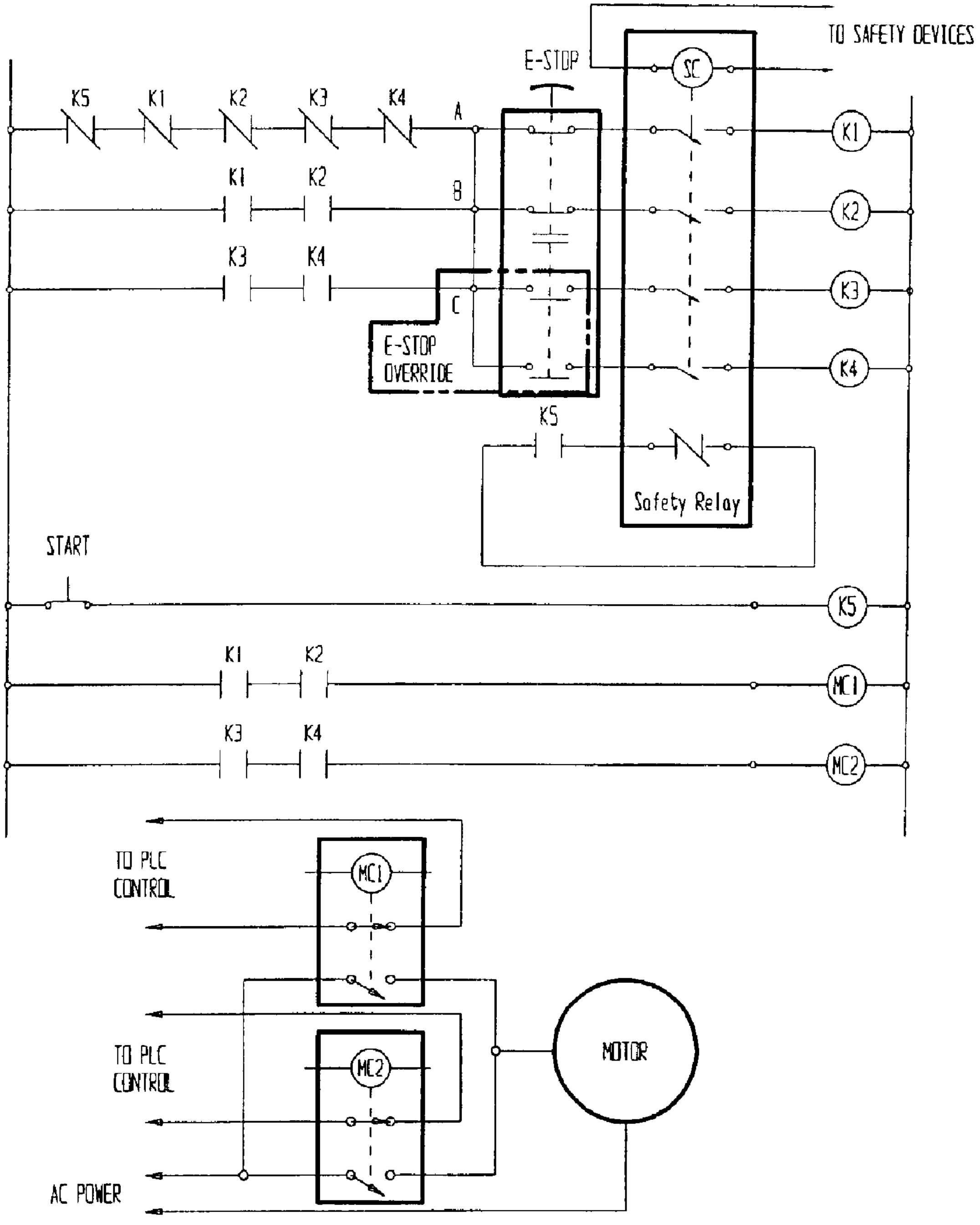
FIG. 10 illustrates the control circuitry of FIG. 2, showing the control circuit in a tied-down state (i.e., start switch contacts fused or stuck closed), the motor will begin to run, through the process described for FIG. 4, but within one cycle the motor will shut down due to contact K5 within a safety relay loop remaining open, due to prolonged energization of coil K5, de-energizing safety coil SC to open the safety relays, thereby de-energizing coils K1, K2, K3, and K4 to de-energize MC1 and MC2.

FIG. 10 illustrates the start switch tied down (start switch fused or stuck closed). The motor stops when a safety device is actuated. When a safety device is actuated, the safety relay coil SC is de-energized, opening the safety relays. Upon depression of the start switch, the motor will begin to run, but when the start switch contacts stick, the motor will shut down within one cycle due to contact K5 within a safety relay loop remaining open, due to prolonged energization of coil K5, de-energizing safety coil SC to open the safety relays, thereby de-energizing coils K1, K2, K3, and K4 to de-energize MC1 and MC2. Since contact K5 (within the safety relay loop) must be closed before the safety device circuit is satisfied (energizing the safety relay coil SC), the safety relay will not reset (remaining open). This prevents an auto restart of the motor when the safety device circuit is not satisfied.

Figure 11:
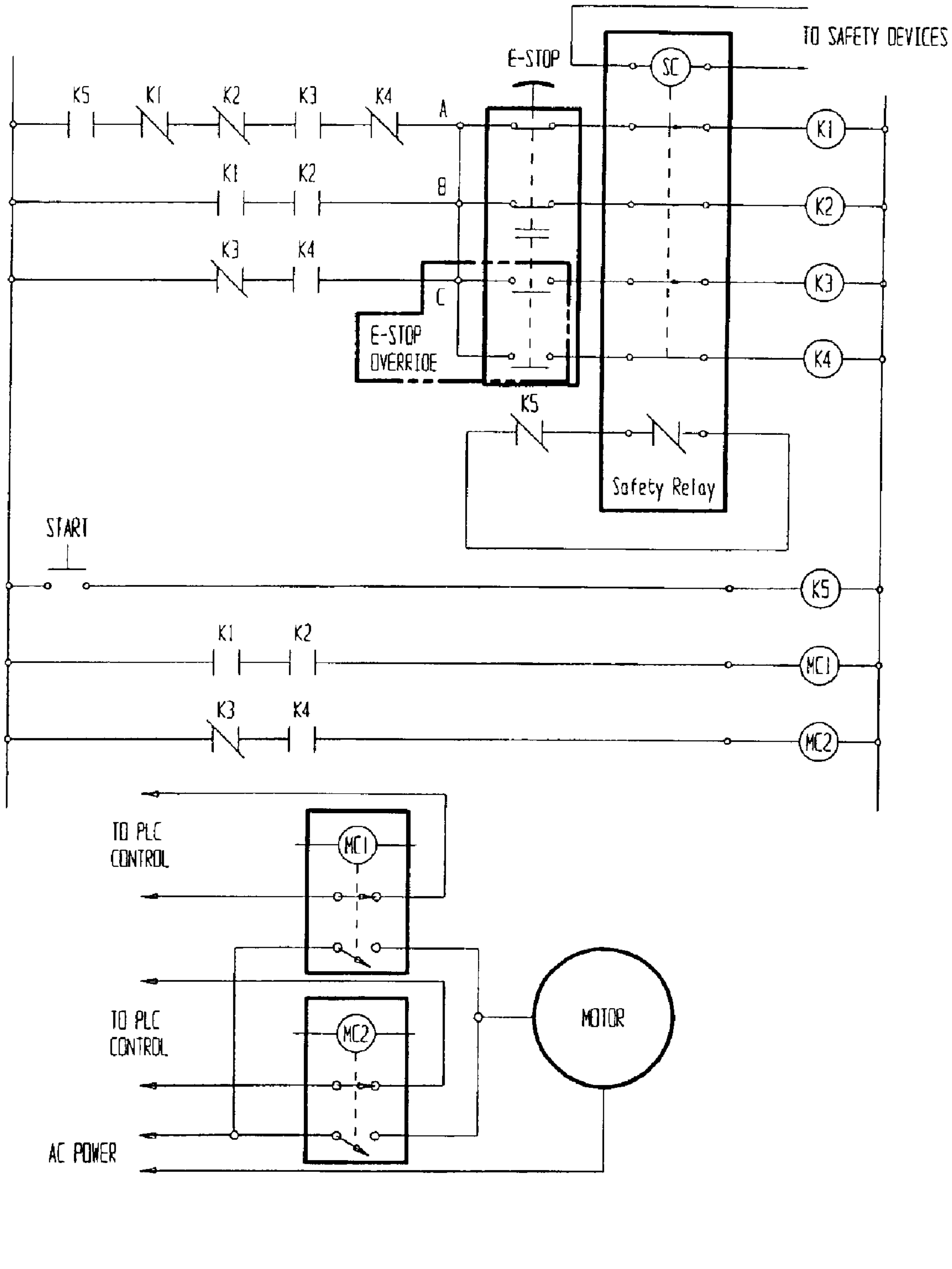
FIG. 11 illustrates the control circuitry of FIG. 2, showing the control circuit with contact K3 (in series with terminal "C") fused closed, captive contact K3 (in series with terminal "A") is, therefore, open, preventing coils K1, K2, and K3 from energizing, thereby preventing motor start-up.
Figure 12:
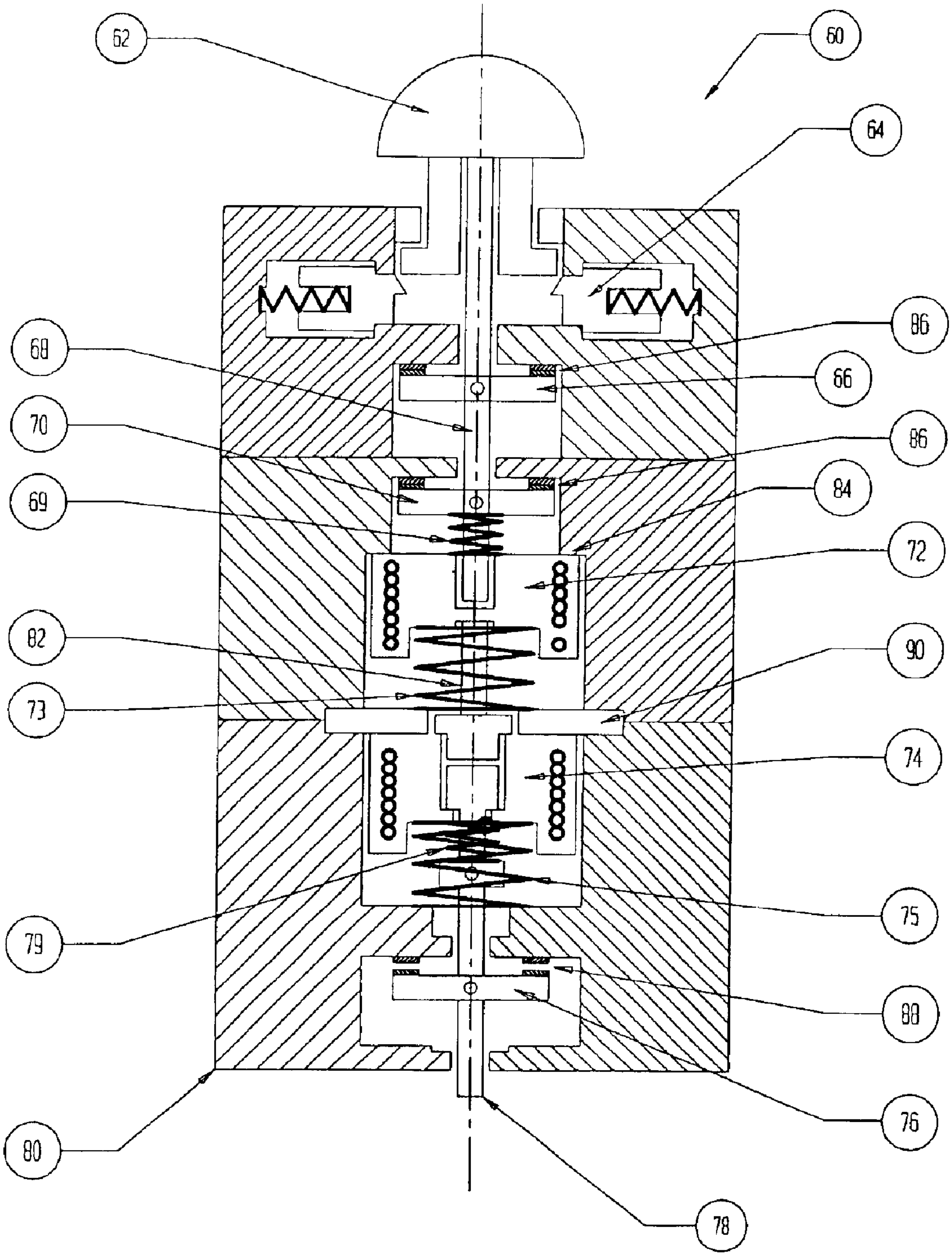
FIG. 12 illustrates a cross-section of a second embodiment of an emergency stop (E-stop) switch of the present invention in a normal position, with primary contacts closed and override contacts open, a motor would be powered by the closing of a motor control contactor governed by a control circuit energized by the closed primary contacts.

FIG. 11 illustrates the contacts of coil K3 held closed (possibly fused). This prevents contacts K1, K2, and K4 from energizing. Contactors MC1 and MC2 remain de-energized. The motor cannot be started. This condition results if any of coil contacts K1, K2, K3 and/or K4 remain closed. All contacts must be open before the motor can be started.

A Second Embodiment of the Emergency Stop (E-stop) Switch:

FIGS. 12 through 15 illustrate a second embodiment of an Emergency Stop (E-stop) switch 60 of the present invention. The E-stop switch 60 of FIGS. 12 through 15 includes a red mushroom knob 62, retaining jaws and spring 64 for manual resetting after E-stop activation, a first, or primary, contact block 66 with four normally closed NC contacts, a primary shaft 68, a primary shaft return spring 69, a supplemental contact block 70 with four normally closed NC contacts, a primary shaft solenoid 72, a primary shaft solenoid return spring 73, a secondary (override) solenoid 74, a secondary solenoid return spring 75, a second (override) contact block 76 with four normally open NO contacts, a secondary shaft 78, a secondary shaft return spring 79, an enclosure 80, and a non-metallic transfer shaft 82.

The primary shaft 68 is fixedly connected to the red mushroom knob 62, the first contact block 66 and the supplemental contact block 70. The primary shaft 68 length must be of a length to slide into the red mushroom head 62, attach and pass through the first and the supplemental contact blocks 66, 70, and terminate within the primary shaft solenoid 72, such that the primary shaft solenoid 72 can move the primary shaft 68 a distance to the open the first and the supplemental contact blocks 66, 70, but not latch the mushroom knob 62 into the retaining jaws and springs 64. The primary shaft return spring 69 is located axially along the primary shaft 68 between and in contact with a bottom of the supplemental contact block 70 and a top of the primary shaft solenoid 72. The force of the primary shaft return spring 69 shall be such to keep the contacts of the first and the supplemental contact blocks 66, 70, closed (considering component weight and the force of gravity), but yet allow contact opening by spring compression during activation of the primary shaft solenoid 72. The primary solenoid return spring 73 force shall be sufficient to fully seat and hold the primary shaft solenoid 72 against a shoulder 84 within the enclosure 80, and yet be capable of compression when the E-stop switch 60 is manually activated by force upon the mushroom knob 62. Also, the primary shaft solenoid return spring 73 should be strong enough to overcome the forces of the primary shaft return spring 69 (in addition to component weight and the force of gravity), meaning, activation of the primary shaft return spring 69 will not unseat the primary shaft solenoid 72.

The secondary shaft 78 must be of a length such that the secondary shaft 78 can be axially activated (drawn in) by the secondary shaft solenoid 74 to attach contacts 88 of the second (override) contact block 88. The secondary shaft solenoid 74 shall be capable of closing the second (override) contact block 88, overcoming the force of the secondary shaft return spring 79 residing axially along the secondary shaft 78 (in addition to component weight and the force of gravity). The secondary shaft solenoid return spring 75 shall be of sufficient strength and size to fully seat and hold the secondary shaft solenoid 74 against a non-metallic barrier 90 with the enclosure 80 (in addition to component weight and the force of gravity). Also, the secondary shaft solenoid return spring 75 shall be capable of compression when the E-stop switch 60 is manually activated by force upon the mushroom knob 62.

The non-metallic transfer shaft 82 must have a length so that the transfer shaft 82 maintains contact with primary shaft solenoid 72 and the secondary shaft solenoid 74. The transfer shaft 82 is guided by a hole in the enclosure 80 (not shown).

Figure 13:
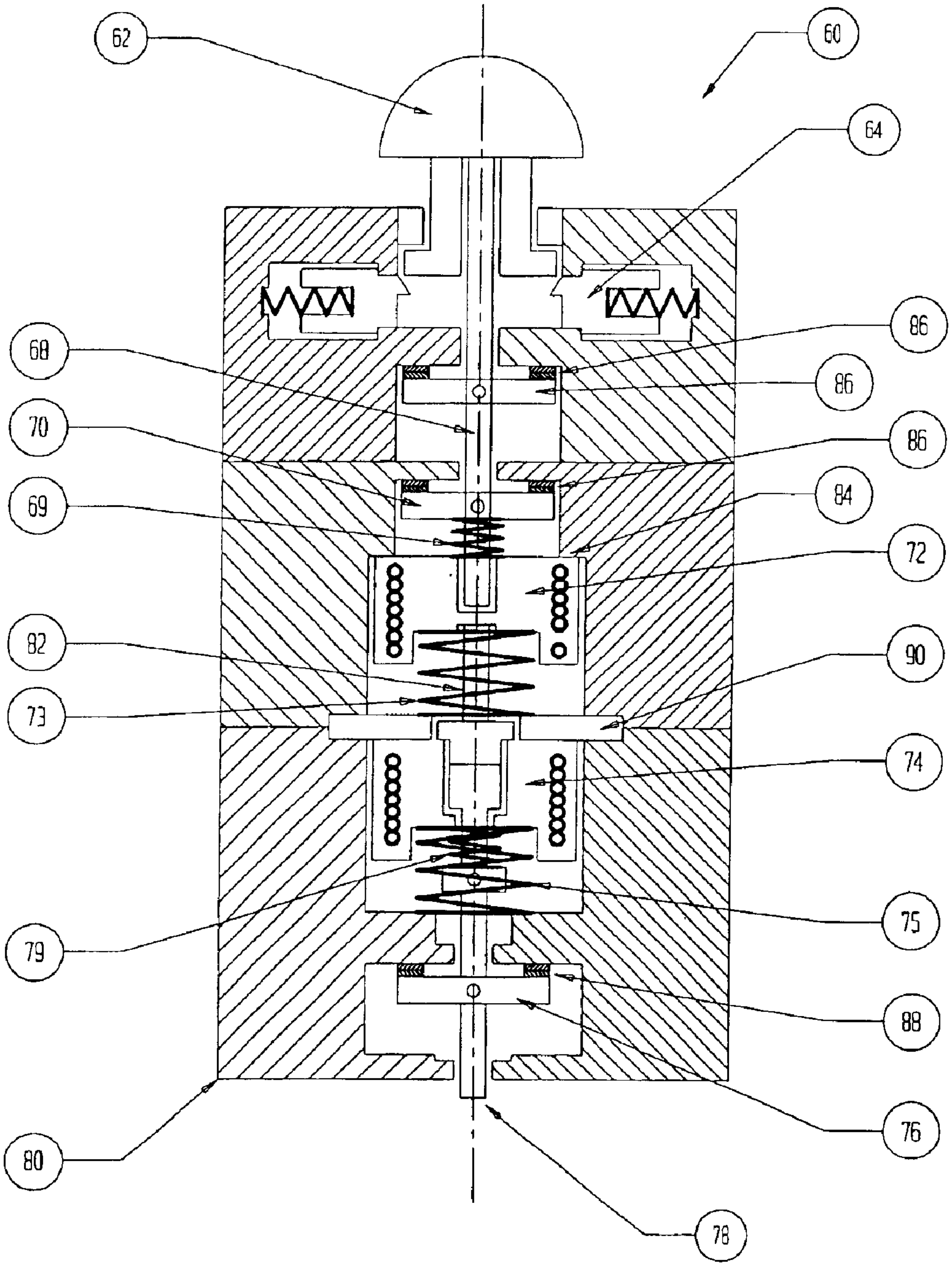
FIG. 13 illustrates the E-stop switch of FIG. 12 with override contacts now closed, two control circuits are now energized, closing two motor control contactors, providing power to the motor by parallel sources.

Method of Operation of the Second E-Stop Switch Embodiment—Remotely Activated Testing The secondary shaft solenoid 74 is activated to close contacts 88 of the secondary (override) contact block 76, as shown in FIG. 13. Closing the contacts 88 of the secondary (override) contact block 76 energizes a second control circuit through the E-stop switch 60, establishing a by-pass to a primary control circuit, allowing testing of the primary control circuit while the equipment is operating.

Figure 14:
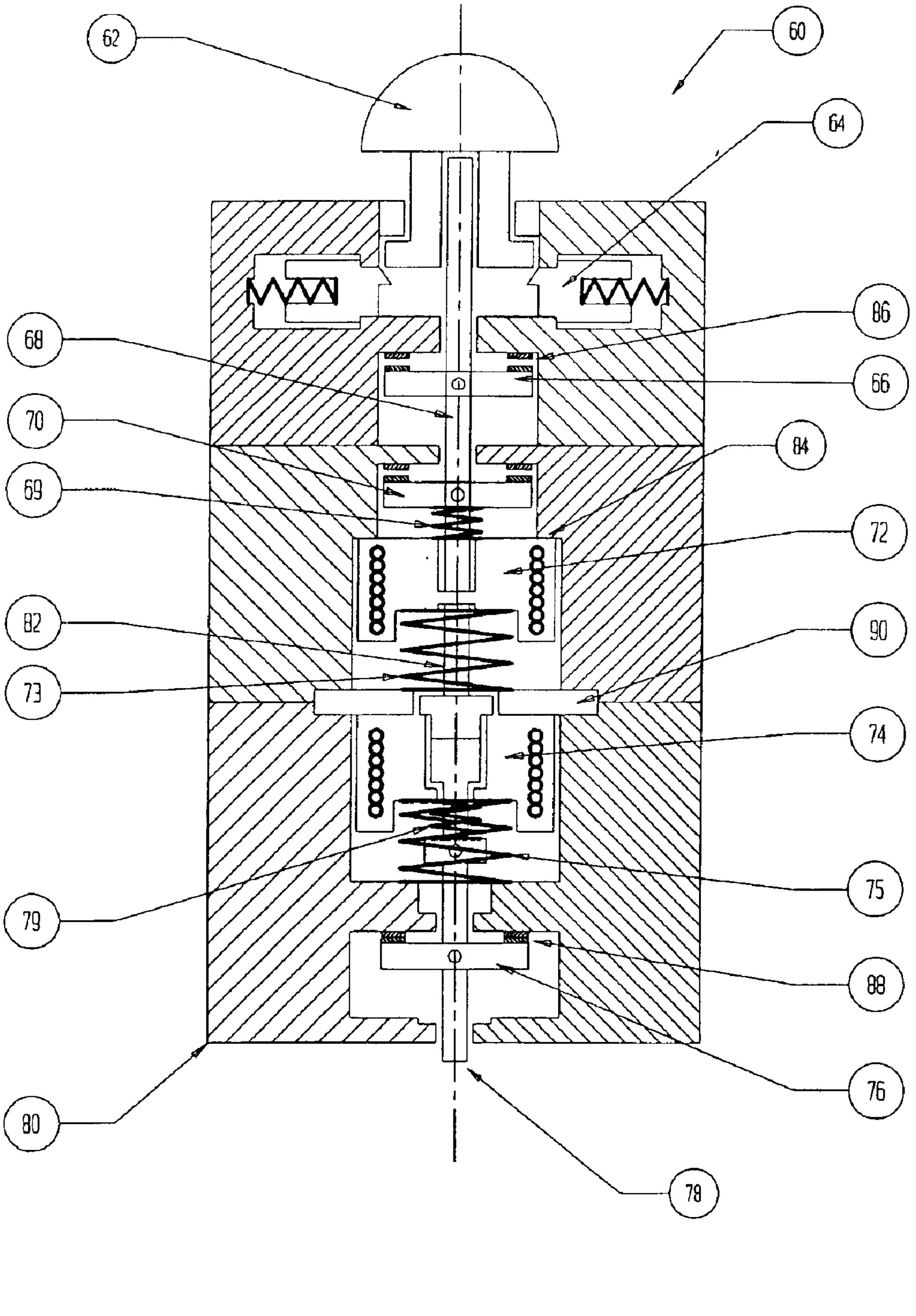
FIG. 14 illustrates the E-stop switch of FIG. 12 with primary contacts now open, the motor continues to operate, the primary control circuit can now be tested.

FIG. 14 illustrates the primary shaft solenoid 72 activated to open the contacts 86 of the first (primary) and the supplemental contact block 66, 70. The PLC (not shown) then tests the contacts 86 of the primary and the supplemental contact block 66, 70 for shorts and opens, as well as other components of the primary control circuitry.

Figure 15:
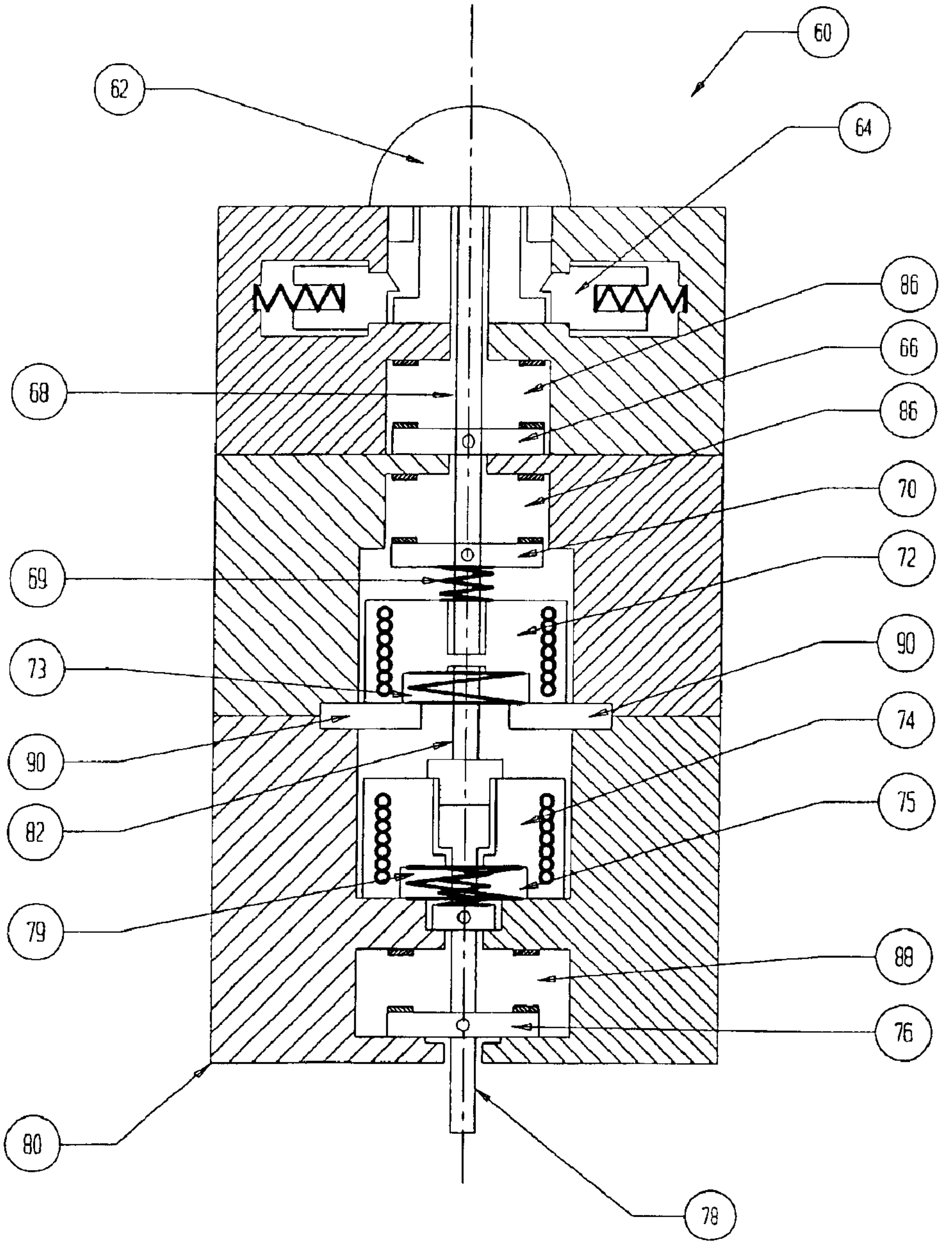
FIG. 15 illustrates the E-stop switch of FIG. 12 manually activated, all contacts therein are locked open, requiring manual reset, all power is shut to the motor regardless of a desired, programmed status for the relays and control circuits.

If, during the test mode, the E-stop switch 60 is manually depressed (activated), as shown in FIG. 15, the primary shaft 68 forces the primary shaft solenoid 72 away from the shoulder 84 of the enclosure 80, which, in turn, moves the transfer shaft 82, displacing the secondary shaft solenoid 74 away from the non-metallic barrier 90 within the enclosure 80. Manual E-stop switch 60 activation opens all contacts 86, 88 of all contact blocks 66, 70, 76, thus opening all of the control circuits, halting all power to the equipment, thereby satisfying all requirements of ANSI/RIA R15.06-1999,4.6.1-emergency stop. Manual activation of the E-stop switch 60 switch opens and locks open all contacts 86, 88 regardless of the status (open or closed) of the primary or the secondary shaft solenoid 72, 78.

Figure 16:
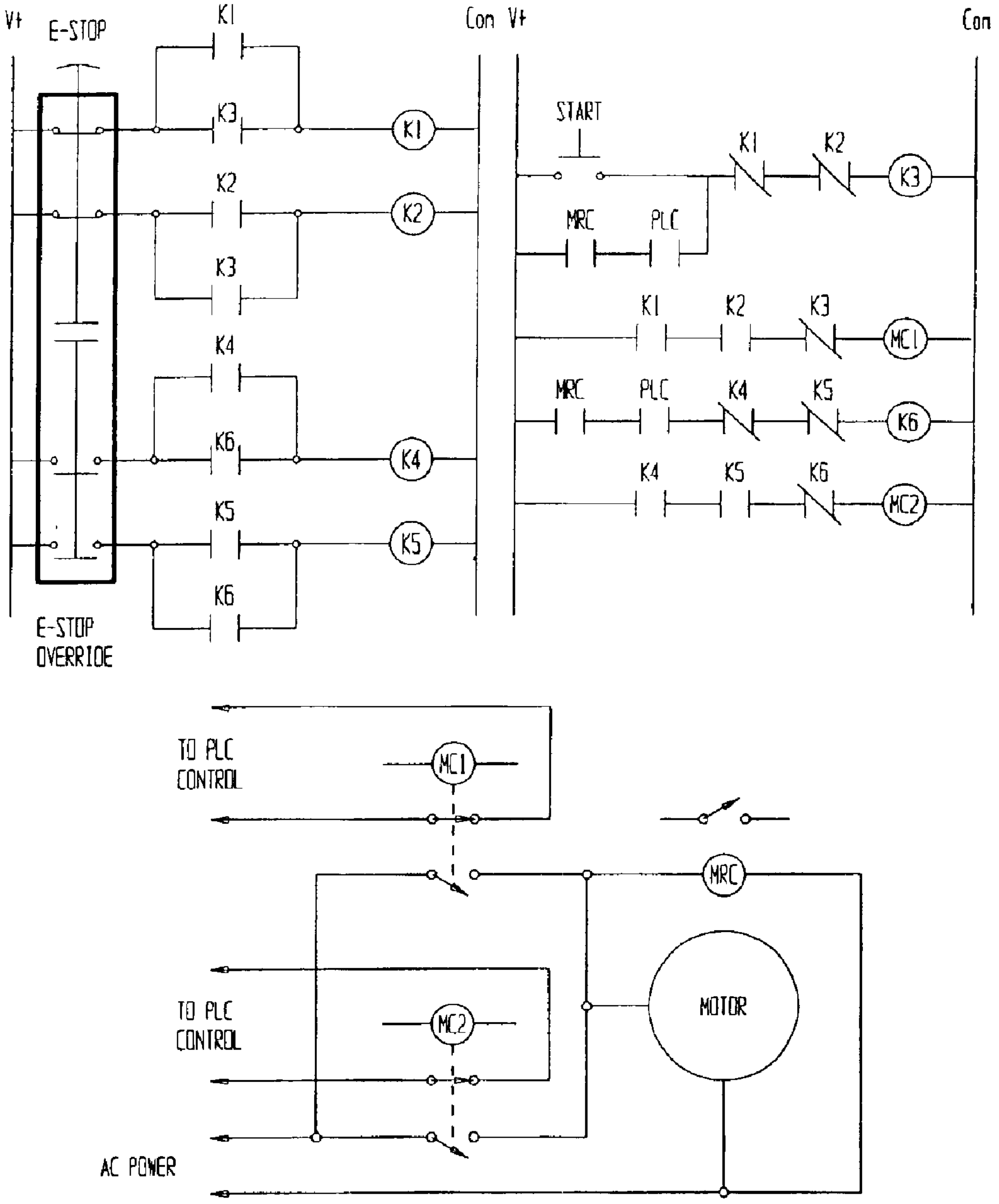
FIG. 16 illustrates a second embodiment of control circuitry of the present invention, incorporating either E-stop switch of the present invention, governing power to a load (equipment) while periodically testing and monitoring the control circuit and E-stop switch.

A Second Embodiment of Control Circuitry with Similar Sequence Testing:

Similar to the first control circuit embodiment, a typical application for the second control circuit embodiment, using either E-stop switch of the present invention, could be a dual safety reliable circuit, as shown in FIG. 16, controlling a single motor, or a plurality of motors and/or equipment, running twenty-four hours per day, seven days per week. In this embodiment (described using component numbers of the second E-stop switch 60), the motor safety circuits can again be checked without shutting off power to the motor or equipment.

The first (primary) contact block 66 could control one safety or control circuit, while another safety or control circuit is controlled by the secondary (override) contact block 76. A PLC could control the primary and the secondary shaft solenoids 72, 78 of the E-stop switch 60. A normally closed captive contact in each of two motor control contactors (one motor control contactor controlled by one or the other of the primary and the secondary (override) contact blocks 66, 76) would be monitored for an open condition to determine if the motor control contactor, the control wiring, and/or the safety circuits are operating properly. The monitoring could also be accomplished by a PLC. If the normally closed captive contact does not close (contacts held open while the motor is running), the PLC could activate a fault light indicating a faulty safety circuit.

A Third Embodiment of Control Circuitry Carrying out a Second Sequence Testing Technique FIGS. 17 through 21 illustrate a second method for testing the E-stop switches and control circuitry of the present invention. Here, a supervised, solenoid actuated E-stop switch can be tested during every machine stop and/or start sequence.

Figure 17:
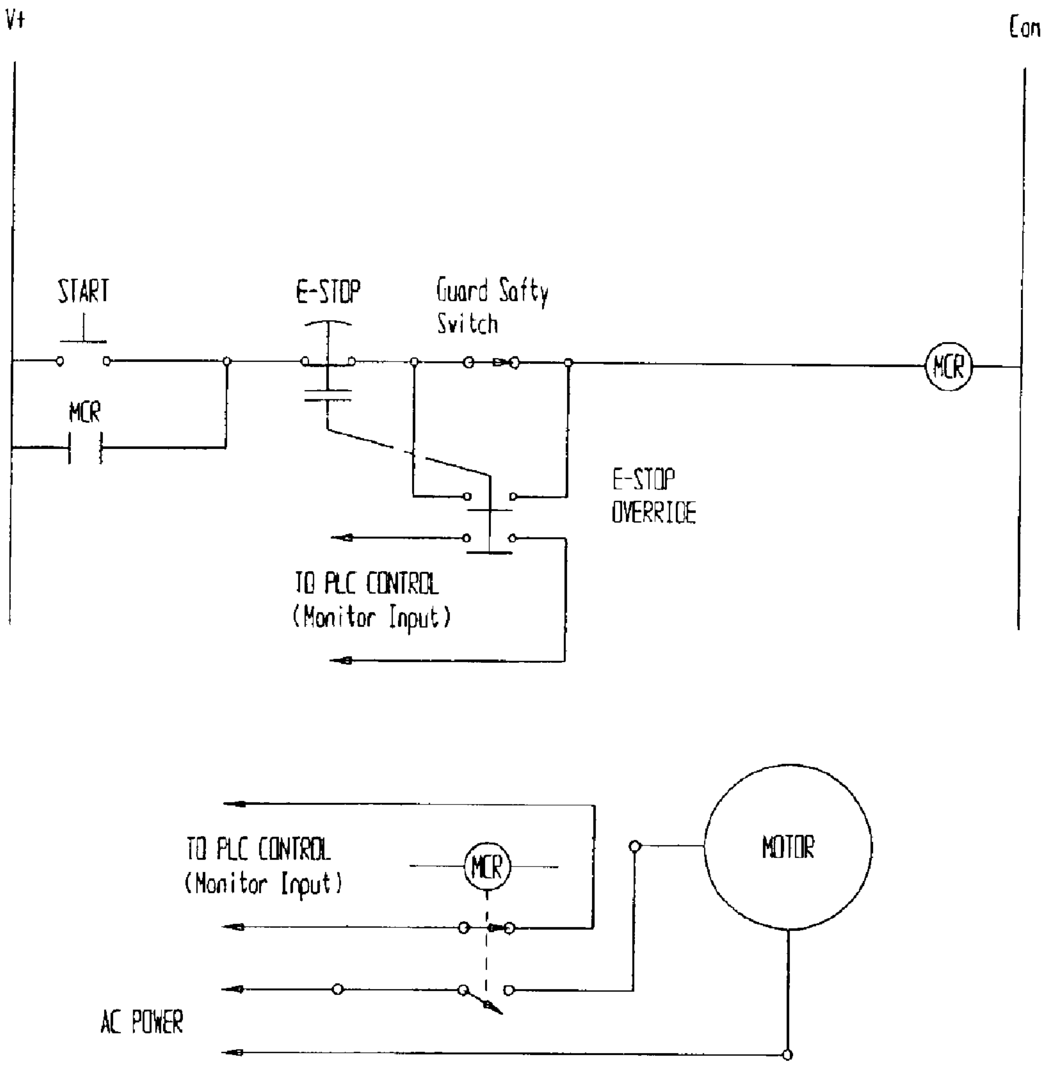
FIG. 17 illustrates a third embodiment of control circuitry of the present invention, providing a motor start-up and stop testing sequence, with an E-stop switch and control logic prior to a cold motor start-up.

FIG. 17 shows the E-stop switch and control logic prior to a cold motor (equipment) start up. The primary contacts of the E-stop are normally closed and the secondary (override) contacts are normally open. The motor control relay MCR is not energized, so the motor is not running.

Figure 18:
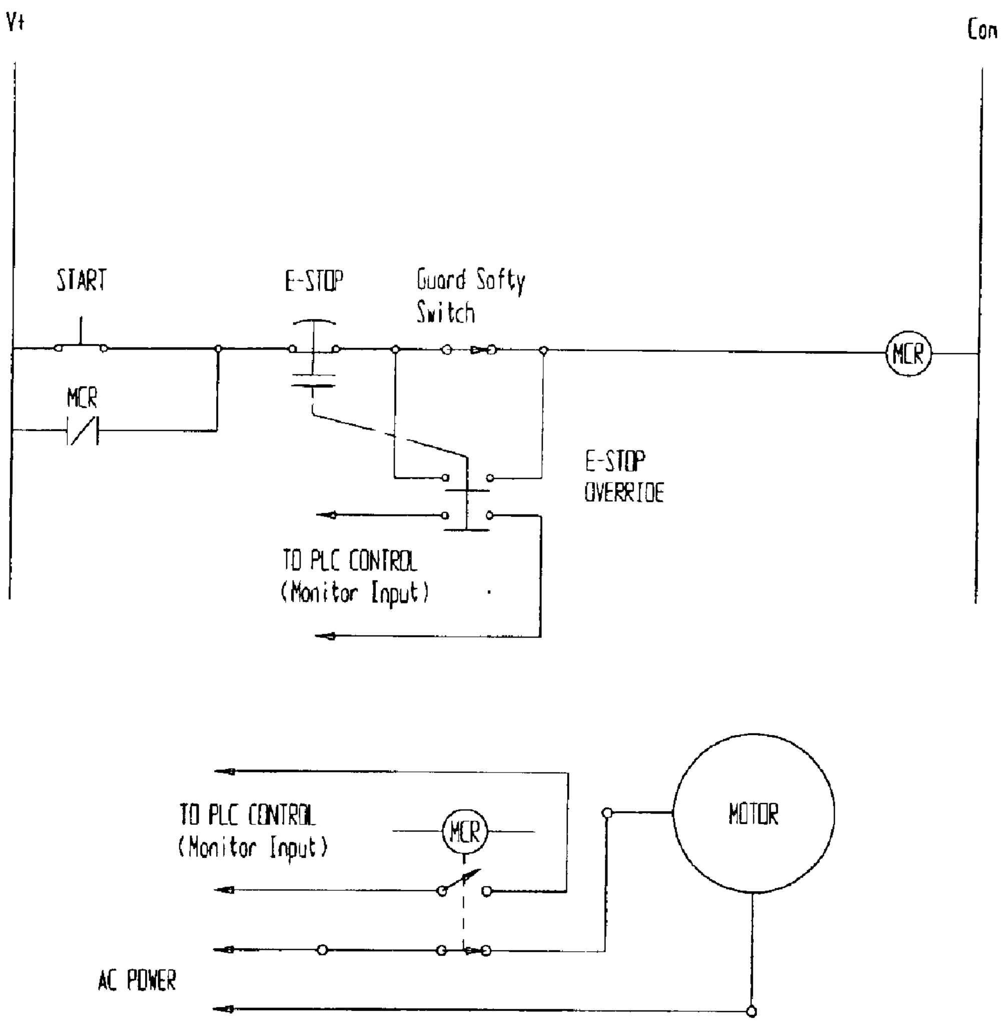
FIG. 18 illustrates the control circuitry of FIG. 17 with the start button depressed, energizing the coil MCR to close associated contact MCR, thereby starting the motor.

FIG. 18 shows the E-stop switch and control logic with the start button depressed. The MCR is now energized, closing the contacts of the MCR. This creates a latching circuit. The MCR will now remain on after the start button is released. The motor is now running.

Figure 19:
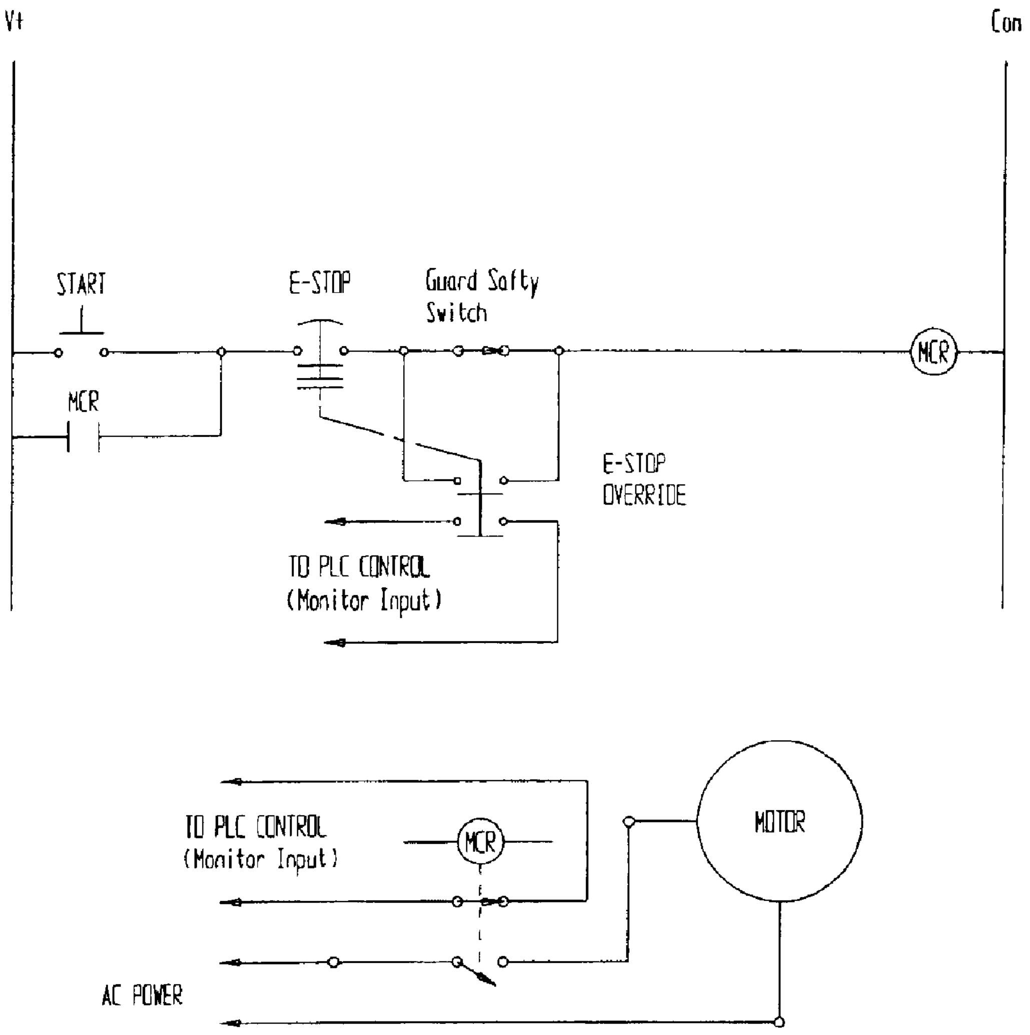
FIG. 19 illustrates the control circuitry of FIG. 17 with the E-stop switch programmably activated, opening all contacts, thereby shutting down the motor and testing control circuitry.

FIG. 19 shows the E-stop switch and control logic with the E-stop activated. This deactivates the MCR, removing power to the motor. In this embodiment, the E-stop is programmed to automatically activate, opening all contacts therein, shutting down the motor, shortly (perhaps seconds) after every motor start-up. This programmed shutdown is a test to ensure that the safety circuit wiring and components are functioning properly. A PLC can be used to activate and monitor the operation of the E-stop switch. A fault indication will result if the MCR does not deactivate during the check.

Figure 20:
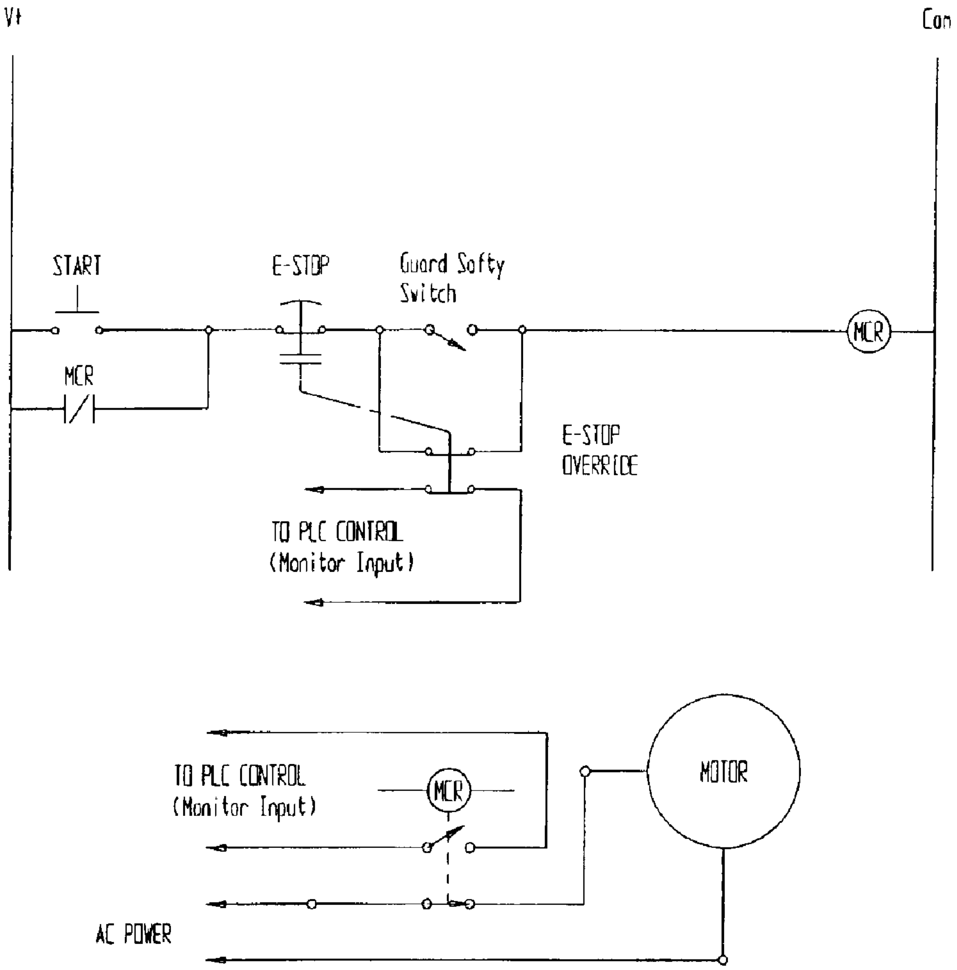
FIG. 20 illustrates the control circuitry of FIG. 17 with the E-stop switch and control logic with a guard safety switch by-passed, enabling a "technician service mode", which sets the motor in a jog or low speed condition, allowing a technician to service or investigate the equipment.

FIG. 20 shows the E-stop switch and control logic with a guard safety switch bypassed. The guard safety switch by-pass enables a "technician service mode", when the guard safety switch is open. The "technician service mode" sets the motor in a jog, or low speed, allowing a technician to analyze machine problems (debug). The "technician service mode" can also be used for equipment set up. The E-stop retains manual activation safety stop capability while the guard safety switch by-pass is activated. A PLC can be used to monitor the secondary (override) contacts. This ensures that the secondary (override) contacts are released before the motor can be switched out of the "technician service mode."

The "technician service mode" of this embodiment also allows for muting with the E-stop switch fully functional. The E-stop switch can be used for disabling the control circuit without having to add a PLC dry contact relay to the control circuit.

Figure 21:
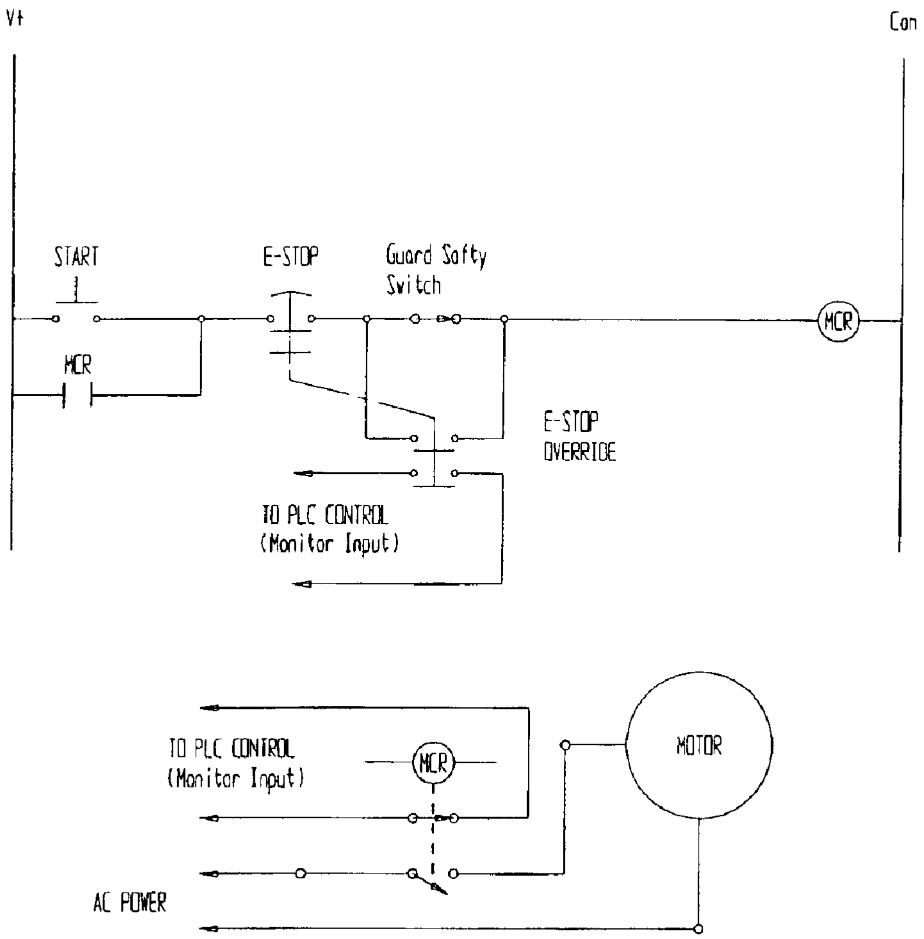
FIG. 21 illustrates the control circuitry of FIG. 17 with the E-stop switch manually activated, opening all contacts to shut down motor operation regardless of any desired, programmed operating condition.

FIG. 21 shows the E-stop switch and control logic with the red mushroom knob manually depressed. All contacts within the E-stop are forced open, shutting down motor operation, regardless if any E-stop relays/solenoids are energized.

An advantage of the second testing sequence embodiment, occurring during machine start up or restart, is the control circuitry does not require two motor source contactors. Accordingly, the second testing sequence embodiment could readily be retrofitted into existing E-stop circuits on existing equipment, reducing the need for scheduled periodic manual testing. The actual testing schedule could be programmed for any time, and programmed as frequently as desired, in accordance with an equipment risk assessment.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention.

What is claimed is:

1. An Emergency Stop (E-stop) Switch, comprising:

a. a first relay governing a first control circuit in the E-stop switch; and b. a second relay governing a second control circuit in the E-stop switch;

wherein transferring energization from the first control circuit to the second control circuit, and vice-versa, allows testing of the deenergized first and second relays and control circuits while:

maintaining electrical operation of equipment served by the E-stop switch; and maintaining manual actuation capability of the E-stop switch to open the first and the second control circuits, resulting in shut down of the equipment served by the E-stop switch.

2. The E-stop switch of claim 1, further allowing testing, in a deenergized state, of all equipment power source control contactors associated with emergency stop capability of the equipment for a failed switch, a fused contact, an inadvertent power source, or a ground.

3. The E-stop switch of claim 1, wherein each relay is any device capable of activating change in an electric circuit in response to a change affecting the device.

4. The E-stop switch of claim 1, wherein each relay includes at least one coil and at least one associated contact.

5. The E-stop switch of claim 1, wherein each relay includes at least one motor and at least one associated contact.

6. The E-stop switch of claim 1, wherein transferring energization is governed by a Programmable Logic Controller (PLC).

7. The E-stop switch of claim 1, wherein manual actuation of the E-stop switch separates a first contact, or first set of contacts, of each relay such a distance from a second contact, or second set of contacts, of the respective relay, that each relay is incapable of maintaining or achieving a closed, state to, thereby, maintain or allow electrical operation of the equipment served by the E-stop switch.

8. The E-stop switch of claim 1, wherein manual actuation of the E-stop switch physically moves a coil and contactors within the E-stop switch such a distance that each relay is incapable of maintaining or achieving a closed state, resulting in shut down of the equipment served by the E-stop switch.

9. The E-stop switch of claim 1, wherein all circuit devices controlling power to the equipment can be tested while maintaining electrical operation of the equipment served by the E-stop switch.

10. The E-stop switch of claim 1, wherein manual actuation of the E-stop switch mechanically moves contactors of the first and the second relays, within the E-stop switch, such a distance that the contactors are incapable of maintaining or achieving a closed state, regardless of an energization state of any coils governing the contactors, resulting in shut down of the equipment served by the E-stop switch.

11. An Emergency Stop (E-stop) Switch, comprising:

a. a first relay governing a first control circuit in the E-stop switch; and b. a second relay governing a second control circuit in the E-stop switch;

wherein:

one of the first or the second relay is closed to energize the respective control circuit, thereby maintaining electrical operation of equipment served by the E-stop switch;

the other of the first or the second relay is open to de-energize the respective control circuit, thereby allowing testing of the respective control circuit during uninterrupted electrical operation of the equipment served by the E-stop switch; and manual actuation of the E-stop switch de-activates electrical operation of the equipment served by the E-stop switch by opening contacts included in each of the first and the second control circuits to open all equipment power source control contactors governing electrical operation of the equipment.

12. A method for testing an Emergency Stop (E-stop) Switch, comprising the steps of:

a. transferring energization from a first control circuit to a second control circuit to maintain electrical operation of equipment served by the E-stop switch before, during, and after the transfer;

b. testing the first control circuit;

c. transferring energization from the second control circuit to the first control circuit to maintain electrical operation of equipment served by the E-stop switch before, during, and after the transfer; and d. testing the second control circuit, wherein all control circuitry and all equipment power source control contactors associated with emergency stop capability of the equipment is tested in a deenergized state during testing of the first and the second control circuits.

13. A method for testing control circuitry of electrically operated equipment served by an Emergency Stop (E-stop) switch, comprising the steps of:

a. transferring energization from a first control circuit to a second control circuit to maintain electrical operation of the equipment before, during, and after the transfer;

b. testing the control circuitry for a failed switch, a fused contact, an inadvertent power source, or a ground;

c. transferring energization from the second control circuit to the first control circuit to maintain electrical operation of the equipment before, during, and after the transfer; and d. further testing the control circuitry for a failed switch, a fused contact, an inadvertent power source, or a ground, wherein manual actuation of the E-stop switch deactivates the equipment by opening contacts governed by the first and the second control circuits.

14. A computer-readable medium that configures a computer system to perform a method for testing an Emergency Stop (E-stop) Switch, the method comprising the steps of:

a. transferring energization from a first control circuit to a second control circuit to maintain electrical operation of equipment served by the E-stop switch before, during, and after the transfer;

b. testing the first control circuit;

c. transferring energization from the second control circuit to the first control circuit to maintain electrical operation of equipment served by the E-stop switch before, during, and after the transfer; and d. testing the second control circuit, wherein all control circuitry and all equipment power source control contactors associated with emergency stop capability of the equipment is tested in a deenergized state during testing of the first and the second control circuits.

15. A computer-readable medium that configures a computer system to perform a method for testing control circuitry of electrically operated equipment served by an Emergency Stop (E-stop) switch, the method comprising the steps of:

a. transferring energization from a first control circuit to a second control circuit to maintain electrical operation of the equipment before, during, and after the transfer;

b. testing the control circuitry for a failed switch, a fused contact, an inadvertent power source, or a ground;

c. transferring energization from the second control circuit to the first control circuit to maintain electrical operation of the equipment before, during, and after the transfer; and d. further testing the control circuitry for a failed switch, a fused contact, an inadvertent power source, or a ground, wherein manual actuation of the E-stop switch deactivates the equipment by opening contacts governed by the first and the second control circuits.

16. An Emergency Stop (E-stop) Switch, comprising:

a first control circuit including at least one coil controlling at least one set of contacts; and a second control circuit including at least one coil controlling at least one set of contacts; wherein:

one of the first or the second control circuits is energized to maintain electrical operation of equipment served by the E-stop switch;

the other of the first or the second control circuits is de-energized, allowing testing of the respective control circuit during uninterrupted electrical operation of the equipment; and manual actuation of the E-stop switch physically moves all of the coils and all of the sets of contacts such a distance that all of the sets of contacts are opened and incapable of maintaining or achieving a closed state, regardless of an energization state of any of the coils, resulting in shut down of the equipment served by the E-stop switch.

17. An Emergency Stop (E-stop) Switch, comprising a plurality of control circuits, each including at least one contactor, wherein:

energizing any one of the control circuits allows energization and operation of equipment served by the E-stop switch and testing of remaining, deenergized control circuits during operation of the equipment;

transferring energization between the plurality of control circuits allows continued energization and operation of the equipment and allows testing of all of the control circuits when placed in a deenergized state; and manual actuation of the E-stop switch deenergizes all of the control circuits, resulting in shut down of the equipment.

* * * * *